United States Patent
Russell et al.

(10) Patent No.: US 9,198,322 B2
(45) Date of Patent: Nov. 24, 2015

(54) COMPLIANT DRAWER LATCH ASSEMBLY

(71) Applicant: Dot Hill Systems Corporation, Longmont, CO (US)

(72) Inventors: Michael Joseph Russell, Longmont, CO (US); David Michael Keffeler, Niwot, CO (US); Andrew Rudolph Heyd, Longmont, CO (US); Christopher Ellis Schroeder, Longmont, CO (US)

(73) Assignee: Dot Hill Systems Corporation, Longmont, CO (US)

( * ) Notice: Subject to any disclaimer, the term of this patent is extended or adjusted under 35 U.S.C. 154(b) by 60 days.

(21) Appl. No.: 14/100,043

(22) Filed: Dec. 9, 2013

(65) Prior Publication Data

US 2014/0265784 A1    Sep. 18, 2014

Related U.S. Application Data

(60) Provisional application No. 61/790,049, filed on Mar. 15, 2013.

(51) Int. Cl.
*E05C 3/12*  (2006.01)
*H05K 7/14*  (2006.01)
*A47B 88/04* (2006.01)

(52) U.S. Cl.
CPC ............. *H05K 7/1489* (2013.01); *A47B 88/04* (2013.01); *H05K 7/1421* (2013.01); *A47B 2210/0018* (2013.01); *A47B 2210/0094* (2013.01); *Y10T 292/1062* (2015.04)

(58) Field of Classification Search
CPC . E05C 3/12; E05C 19/022; H01L 2023/4081; H01L 2023/4087; H05K 7/1421; H05K 7/1489; A47B 88/04; A47B 2210/0018; A47B 2210/0094

USPC ............. 312/215–222, 334.44–334.47, 333; 292/229; 361/679.35, 679.37–679.38, 361/679.43, 679.58, 726–727
See application file for complete search history.

(56) References Cited

U.S. PATENT DOCUMENTS 2,566,064 A * 8/1951 Keim ........................... 361/724
3,348,867 A * 10/1967 Stubblefield et al. ......... 292/122
4,370,007 A    1/1983 Fler
4,610,487 A    9/1986 Delmege et al.
(Continued)

OTHER PUBLICATIONS

Wikipedia "Thermoplastic polyurethane", downloaded Oct. 18, 2013, from https://en.wikipedia.org/wiki/Thermoplastic_polyurethane.
(Continued)

*Primary Examiner* — Daniel J Troy
*Assistant Examiner* — Ryan A Doyle
(74) *Attorney, Agent, or Firm* — Thomas J. Lavan

(57) ABSTRACT

A compliant drawer latch is provided. The compliant drawer latch includes a first portion affixed to an inside surface of a chassis, and a second portion coupled to the first portion. The second portion includes a latch strike plate, a latch spring cap plate, and a latch return spring arranged between the latch strike plate and the latch spring cap plate. A drawer contacts the latch strike plate when the drawer is seated in the chassis. When the drawer over-travels the latch strike plate compresses the latch return spring up to a predetermined distance, and the compressed latch return spring applies force to the latch strike plate to return the latch strike plate to a latching position when the drawer rebounds from over-travel.

20 Claims, 34 Drawing Sheets

(56) References Cited

U.S. PATENT DOCUMENTS

| | | | |
|---|---|---|---|
| 4,696,582 A | 9/1987 | Kasten | |
| 4,730,364 A * | 3/1988 | Tat-Kee | 361/679.09 |
| 5,181,781 A | 1/1993 | Wojcik | |
| 5,328,401 A * | 7/1994 | DeMars | 446/295 |
| 5,507,571 A | 4/1996 | Hoffman | |
| 5,722,750 A | 3/1998 | Chu | |
| 6,126,255 A | 10/2000 | Yang | |
| 6,182,169 B1 * | 1/2001 | Force et al. | 710/62 |
| 6,254,209 B1 | 7/2001 | Parvin | |
| 6,435,636 B1 | 8/2002 | MacMillan | |
| 6,535,381 B2 | 3/2003 | Jahne et al. | |
| 6,535,390 B1 * | 3/2003 | Lo | 361/726 |
| 6,600,648 B2 | 7/2003 | Curlee et al. | |
| 6,611,424 B2 | 8/2003 | Huang | |
| 6,661,671 B1 | 12/2003 | Franke et al. | |
| 6,789,862 B2 | 9/2004 | Shih-Long et al. | |
| 6,824,233 B2 | 11/2004 | Chen et al. | |
| 6,910,557 B2 | 6/2005 | Doornbos et al. | |
| 6,932,511 B2 | 8/2005 | Doornbos et al. | |
| 6,979,065 B2 | 12/2005 | Egger | |
| 6,999,306 B2 | 2/2006 | Walczak et al. | |
| 7,086,708 B2 | 8/2006 | Tseng et al. | |
| 7,251,130 B2 | 7/2007 | Tsai | |
| 7,254,741 B1 | 8/2007 | Sardella et al. | |
| 7,296,116 B2 | 11/2007 | Davis et al. | |
| 7,296,117 B2 | 11/2007 | Davis et al. | |
| 7,349,204 B2 | 3/2008 | Tanaka et al. | |
| 7,359,186 B2 | 4/2008 | Honda et al. | |
| 7,359,189 B2 | 4/2008 | Chiang et al. | |
| 7,362,565 B2 | 4/2008 | Imblum | |
| 7,375,923 B2 | 5/2008 | DeCenzo et al. | |
| 7,436,658 B1 | 10/2008 | Haager et al. | |
| 7,474,532 B1 * | 1/2009 | Desrosiers et al. | 361/719 |
| 7,486,526 B1 | 2/2009 | Frangioso et al. | |
| 7,545,639 B2 * | 6/2009 | Ridge | 361/690 |
| 7,583,507 B2 | 9/2009 | Starr et al. | |
| 7,697,278 B2 | 4/2010 | Peng et al. | |
| 7,742,308 B1 | 6/2010 | King et al. | |
| 7,864,538 B2 | 1/2011 | Wadsworth et al. | |
| 7,864,539 B2 | 1/2011 | Dunham et al. | |
| 7,948,759 B2 | 5/2011 | Ye | |
| 7,952,883 B2 | 5/2011 | Hidaka | |
| 8,120,922 B2 | 2/2012 | Randall et al. | |
| 8,191,841 B2 | 6/2012 | Jeffery et al. | |
| 8,205,951 B2 | 6/2012 | Boks | |
| 8,496,493 B2 | 7/2013 | Lin et al. | |
| 8,743,549 B2 | 6/2014 | Frink et al. | |
| 8,755,178 B2 | 6/2014 | Zheng et al. | |
| 2003/0016587 A1 | 1/2003 | Wilson et al. | |
| 2003/0147220 A1 | 8/2003 | Fairchild | |
| 2004/0017138 A1 | 1/2004 | Mueller et al. | |
| 2005/0182889 A1 | 8/2005 | Davis et al. | |
| 2005/0182898 A1 | 8/2005 | Davis et al. | |
| 2005/0185374 A1 | 8/2005 | Wendel et al. | |
| 2006/0291159 A1 * | 12/2006 | Jiang et al. | 361/685 |
| 2007/0230111 A1 | 10/2007 | Starr et al. | |
| 2007/0247804 A1 | 10/2007 | Li et al. | |
| 2008/0011564 A1 | 1/2008 | Chen et al. | |
| 2008/0073469 A1 * | 3/2008 | Mushan et al. | 248/205.1 |
| 2008/0304803 A1 * | 12/2008 | Krampotich et al. | 385/135 |
| 2009/0237877 A1 | 9/2009 | Honda et al. | |
| 2010/0172083 A1 | 7/2010 | Randall et al. | |
| 2010/0172087 A1 | 7/2010 | Jeffery et al. | |
| 2011/0032665 A1 | 2/2011 | Huang et al. | |
| 2011/0069441 A1 | 3/2011 | Killen et al. | |
| 2011/0188815 A1 * | 8/2011 | Blackwell et al. | 385/88 |
| 2012/0084579 A1 | 4/2012 | Izquierdo et al. | |
| 2012/0127648 A1 | 5/2012 | Randall et al. | |
| 2012/0134086 A1 | 5/2012 | Zhang | |
| 2012/0212909 A1 | 8/2012 | Jeffery et al. | |
| 2013/0050955 A1 | 2/2013 | Shinsato et al. | |
| 2013/0077900 A1 * | 3/2013 | Lowe et al. | 384/18 |
| 2013/0104467 A1 | 5/2013 | Yamao et al. | |
| 2013/0176677 A1 | 7/2013 | Rust et al. | |
| 2013/0230262 A1 | 9/2013 | Park et al. | |
| 2013/0265725 A1 | 10/2013 | Harvilchuck | |
| 2014/0203696 A1 | 7/2014 | Rust | |
| 2014/0204522 A1 | 7/2014 | Keffeler | |
| 2014/0204525 A1 | 7/2014 | Pecone | |
| 2014/0204537 A1 | 7/2014 | Rust | |
| 2014/0265794 A1 | 9/2014 | Schroeder | |

OTHER PUBLICATIONS

Wikipedia "Shore Durometer", downloaded Oct. 18, 2013, from https://en.wikipedia.org/wiki/Shore_durometer.
Official Action for U.S. Appl. No. 13/747,609, mailed Oct. 2, 2014.
Official Action for U.S. Appl. No. 13/747,623, mailed Sep. 24, 2014.
Official Action for U.S. Appl. No. 13/747,637, mailed Oct. 23, 2014.
International search report for application PCT/US 14/23951, dated Sep. 8, 2014.
Written opinion for application PCT/US 14/23951, dated Sep. 8, 2014.
International search report for application PCT/US 14/10671, dated May 14, 2014.
International search report for application PCT/US 14/12777, dated May 13, 2014.
International search report for application PCT/US 14/12785, dated May 14, 2014.
Written opinion for application PCT/US 14/10671, dated May 14, 2014.
Written opinion for application PCT/US 14/12777, dated May 13, 2014.
Written opinion for application PCT/US 14/12785, dated May 14, 2014.
International search report for application PCT/US 14/12789, dated May 13, 2014.
Written opinion for application PCT/US 14/12789, dated May 13, 2014.
Official Action for U.S. Appl. No. 14/100,053, mailed Jun. 8, 2015.
Notice of Allowance for U.S. Appl. No. 13/747,637, mailed Jun. 15, 2015.
Official Action for U.S. Appl. No. 13/747,585, mailed Apr. 21, 2015.
Notice of Allowance for U.S. Appl. No. 13/747,623, mailed Feb. 25, 2015.
Notice of Allowance for U.S. Appl. No. 13/747,637, mailed May 12, 2015.
Official Action for U.S. Appl. No. 13/747,609, mailed May 4, 2015.
ThomasNet: "Interlock system allows only 1 drawer to open at a time", http://news.thomasnet.com/fullstory/Interlock-System-allows-only-1-drawer-to-open-at-a-time, dated Apr. 5, 2011.

* cited by examiner

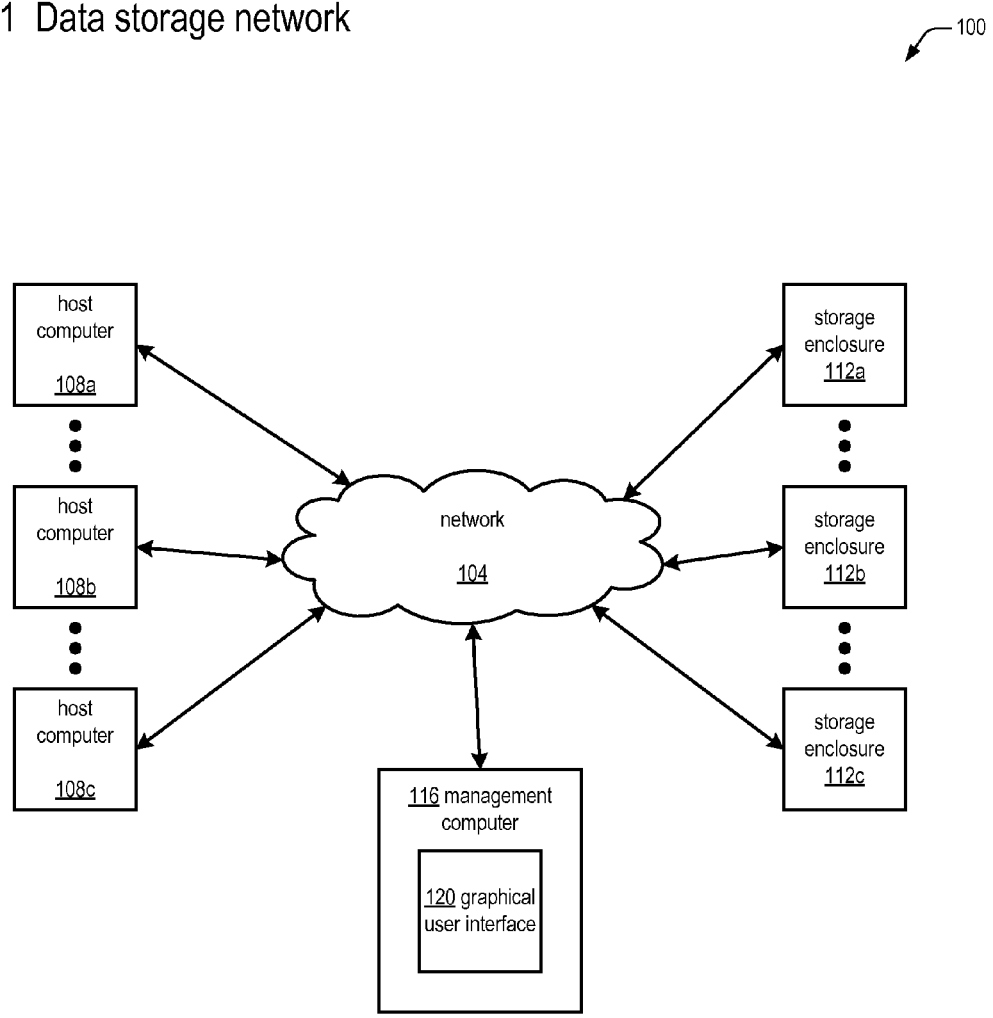
Fig. 1 Data storage network

Fig. 2a  Host-based or expansion data storage system
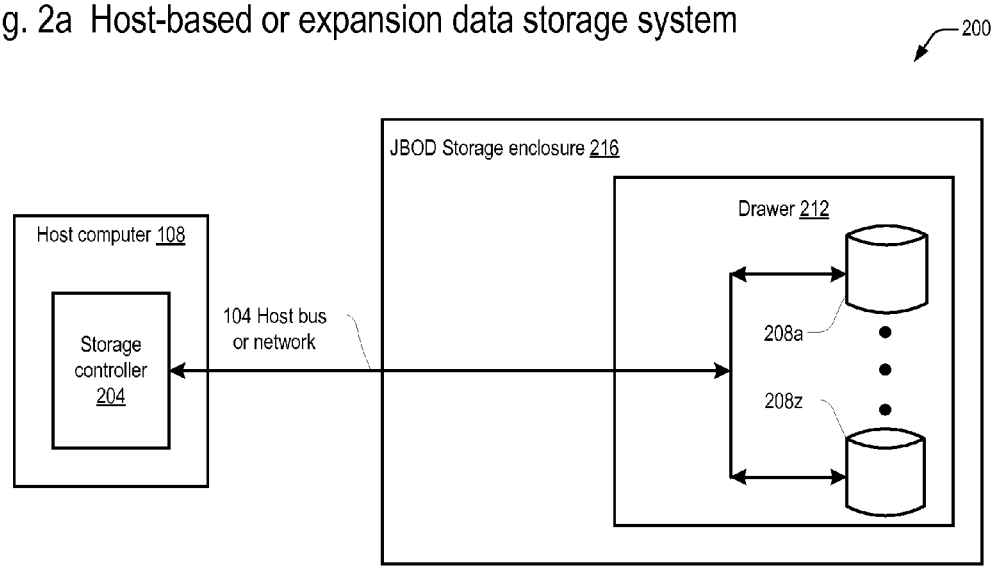
Fig. 2b  Non host-based data storage system
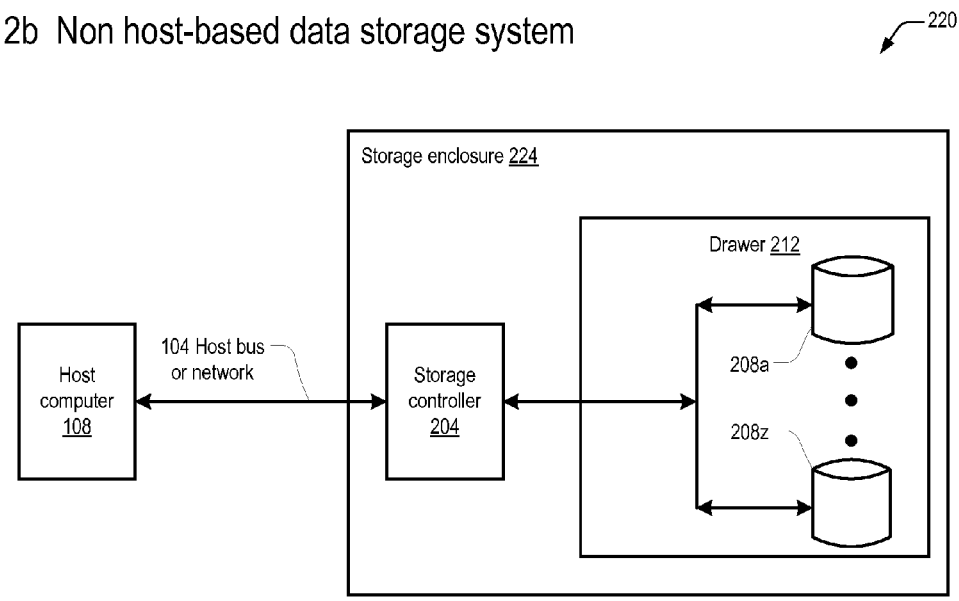

Fig. 3a Storage enclosure with front bezel
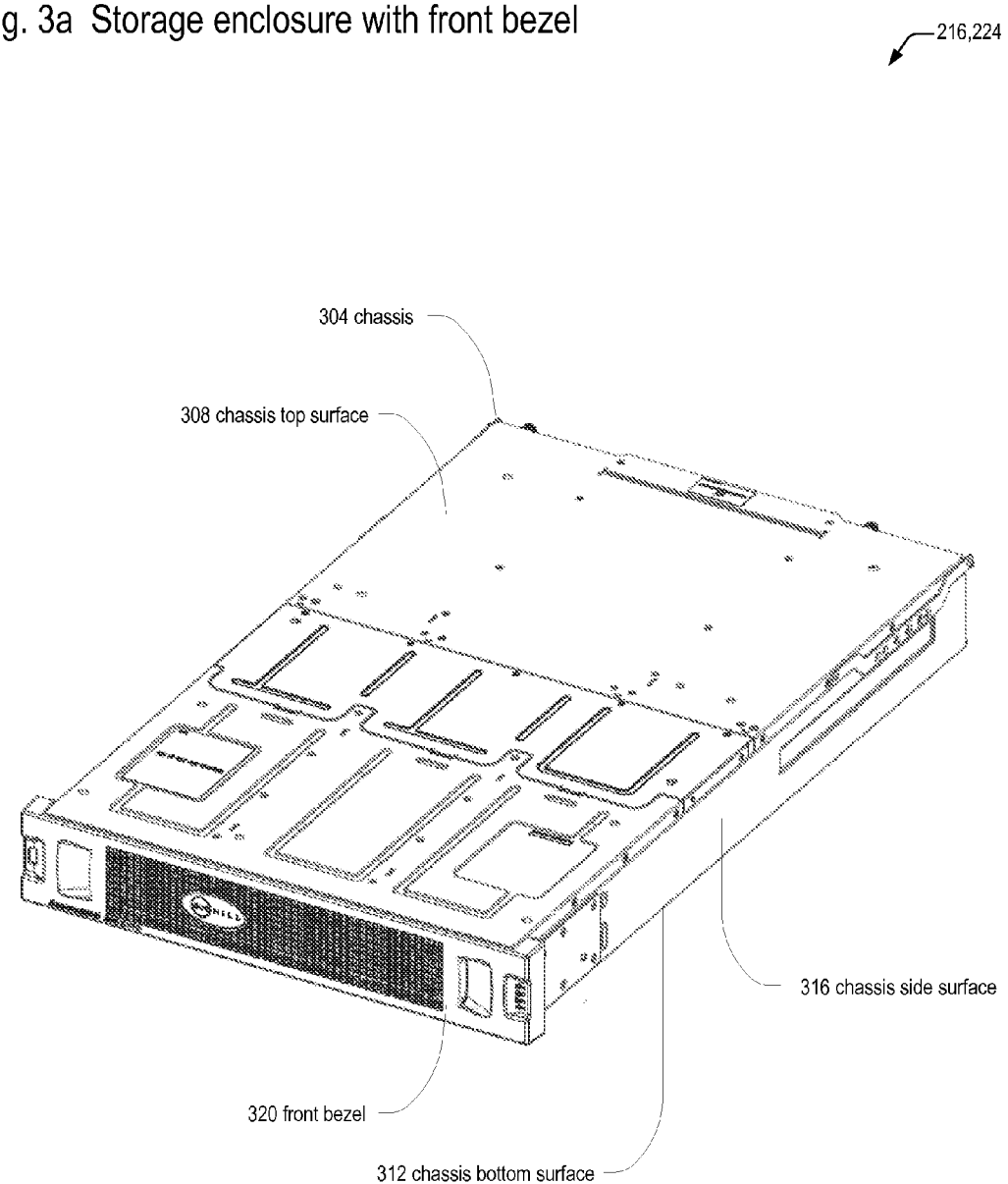

Fig. 3b Storage enclosure without front bezel
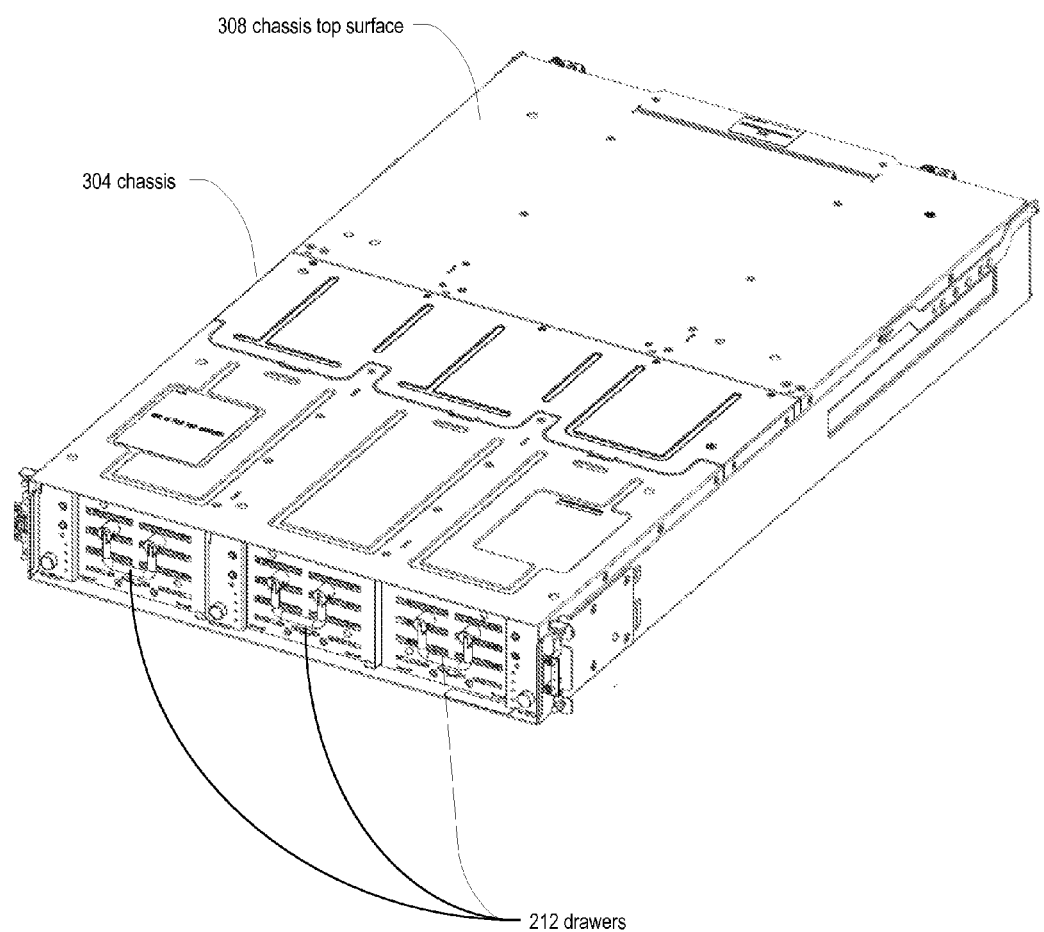

Fig. 3c Storage enclosure with drawer extended
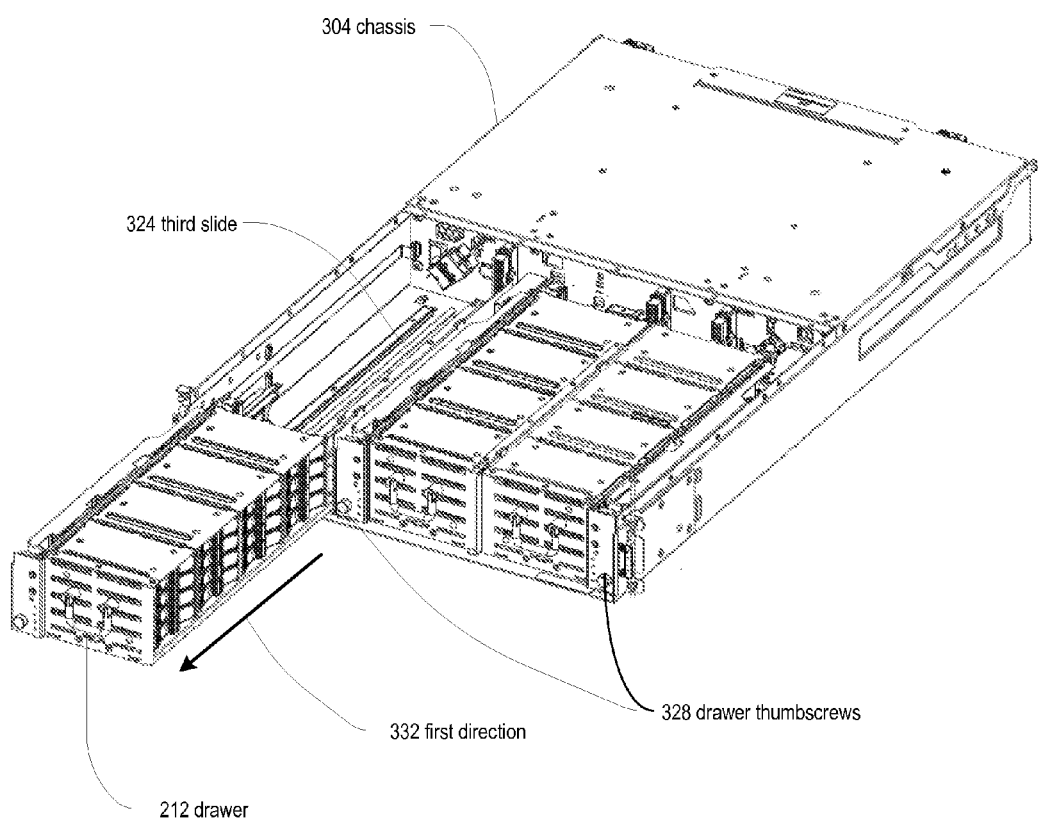

Fig. 3d  Storage device mounting in a drawer
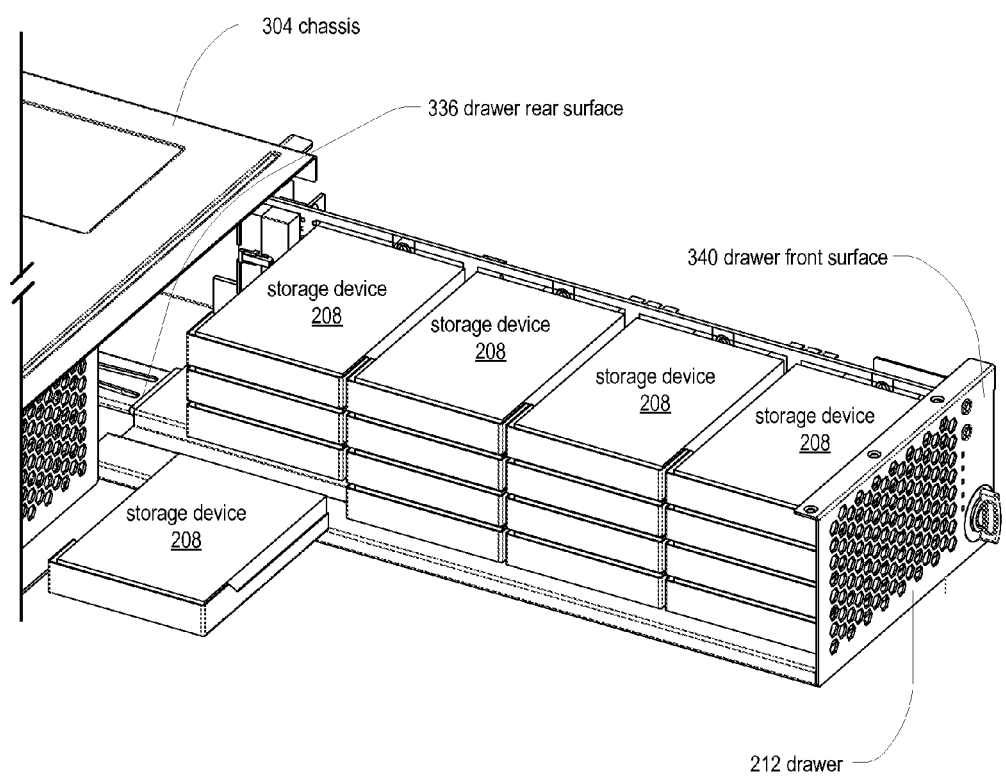

Fig. 3e Chassis components without drawers
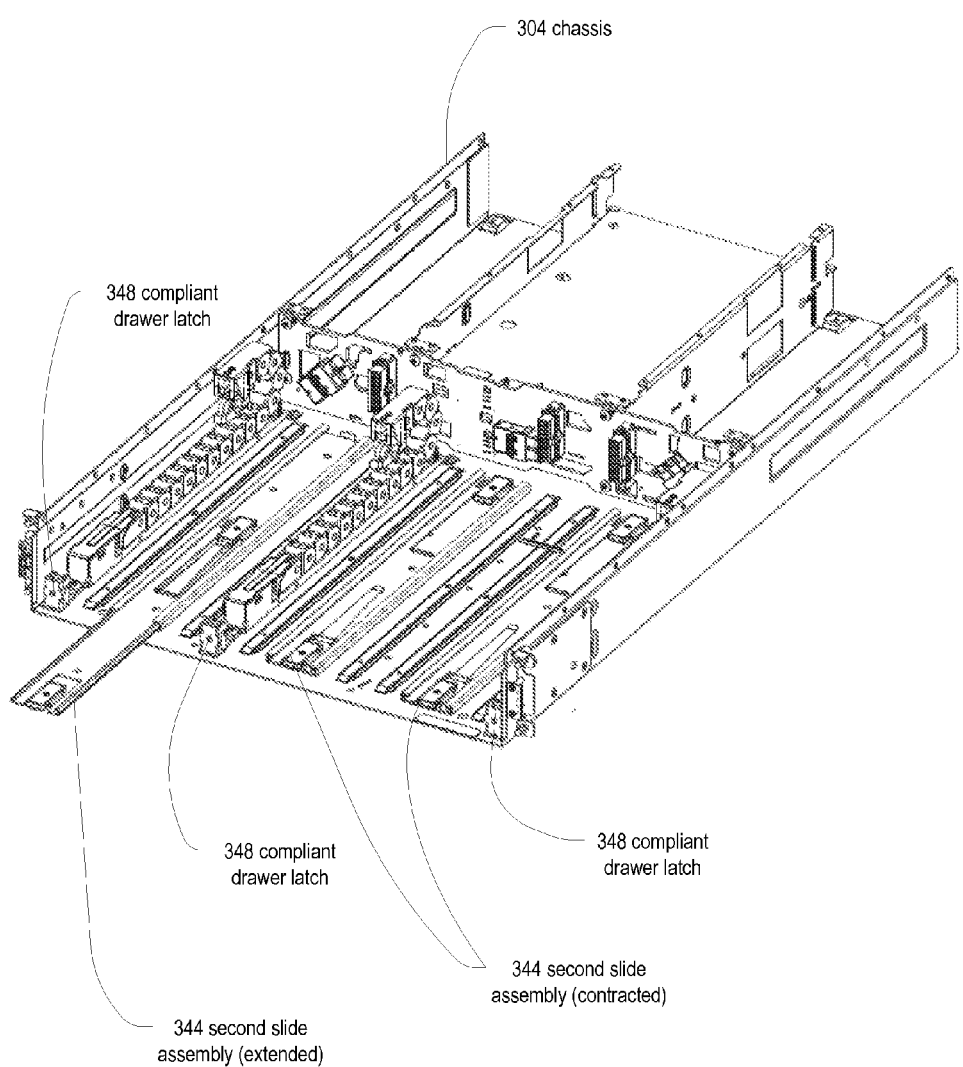

Fig. 3f  Partially assembled chassis
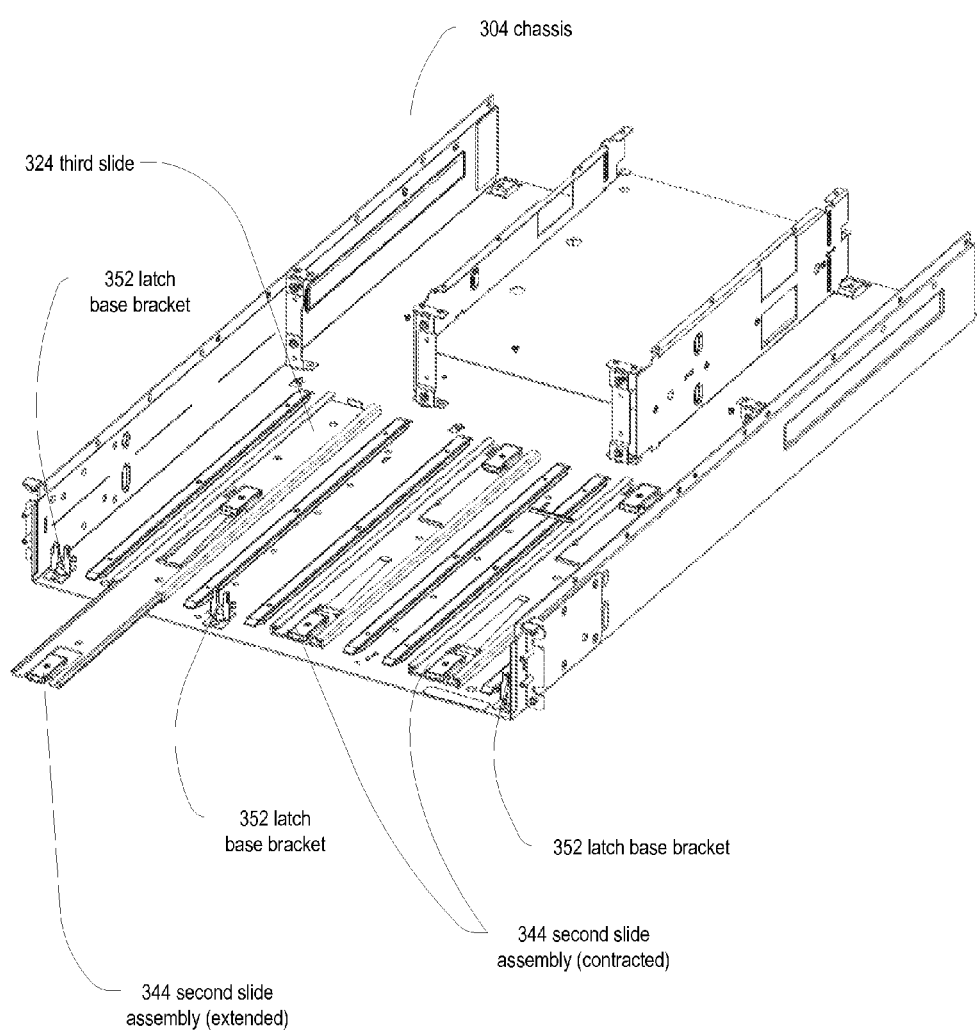

Fig. 3g Storage enclosure bottom view
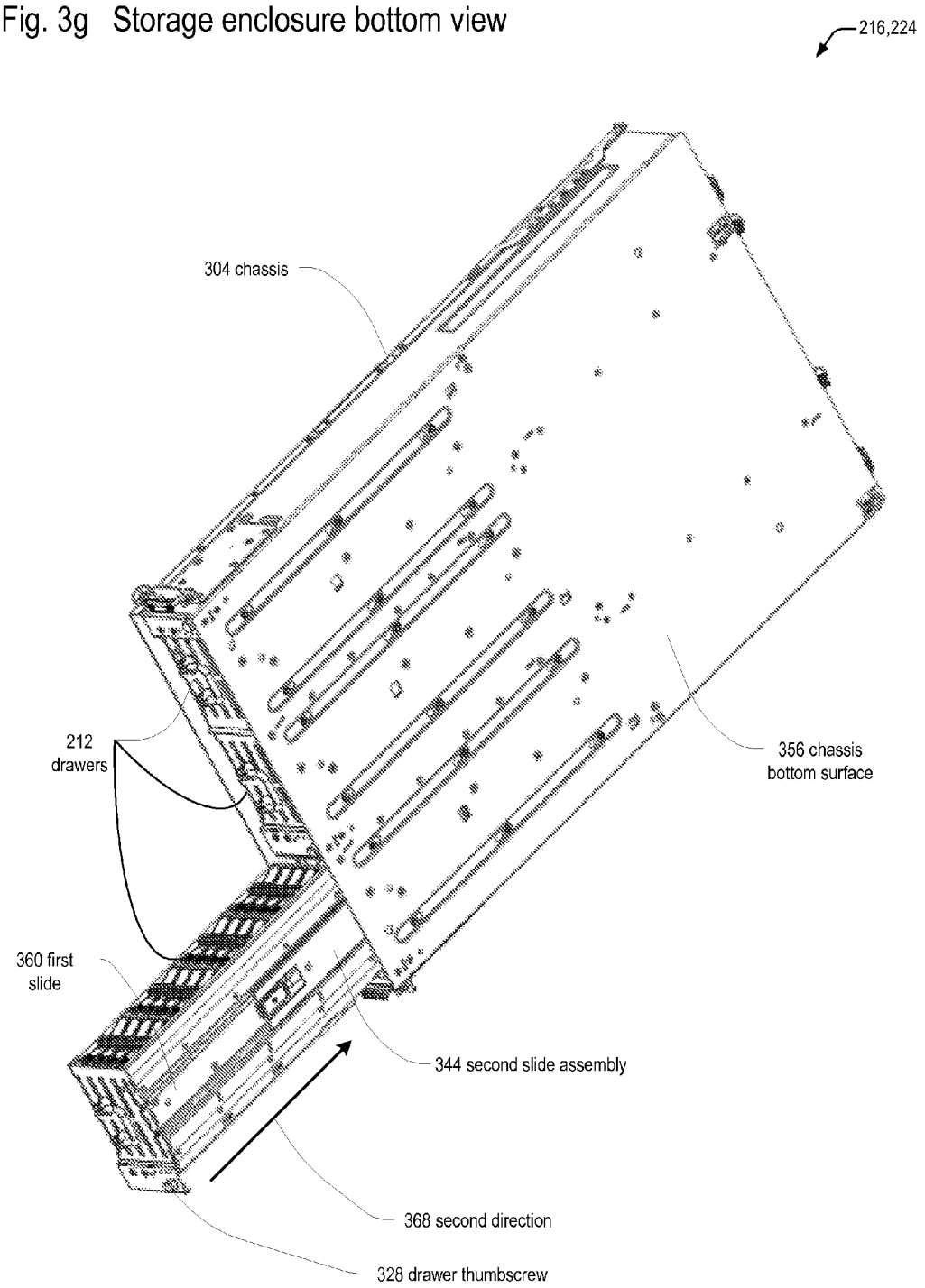

Fig. 4a  Drawer slide assembly top view
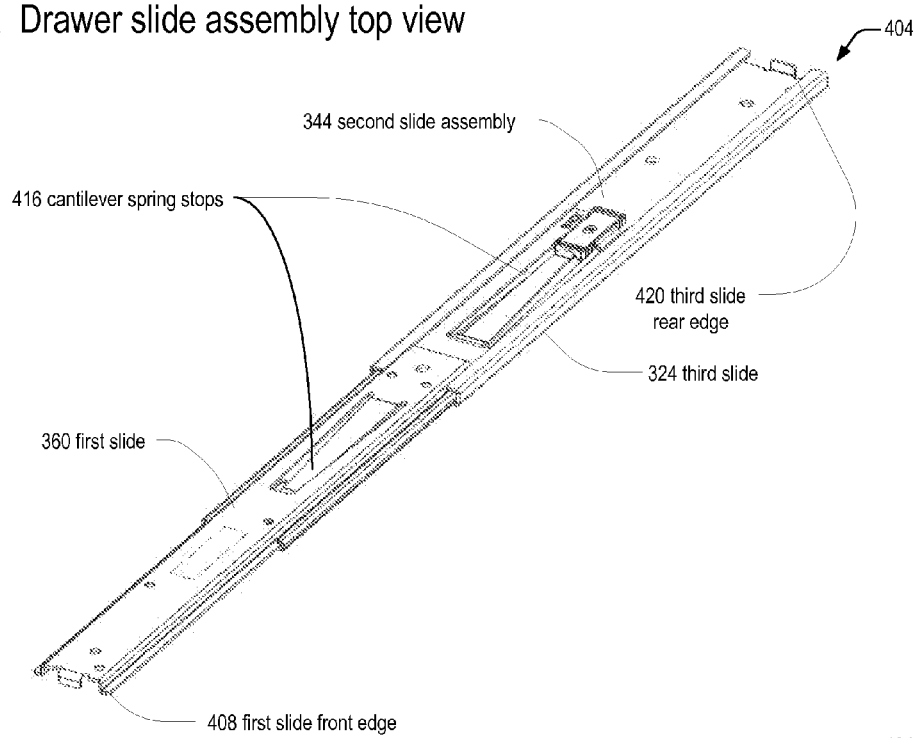
Fig. 4b  Drawer slide assembly bottom view
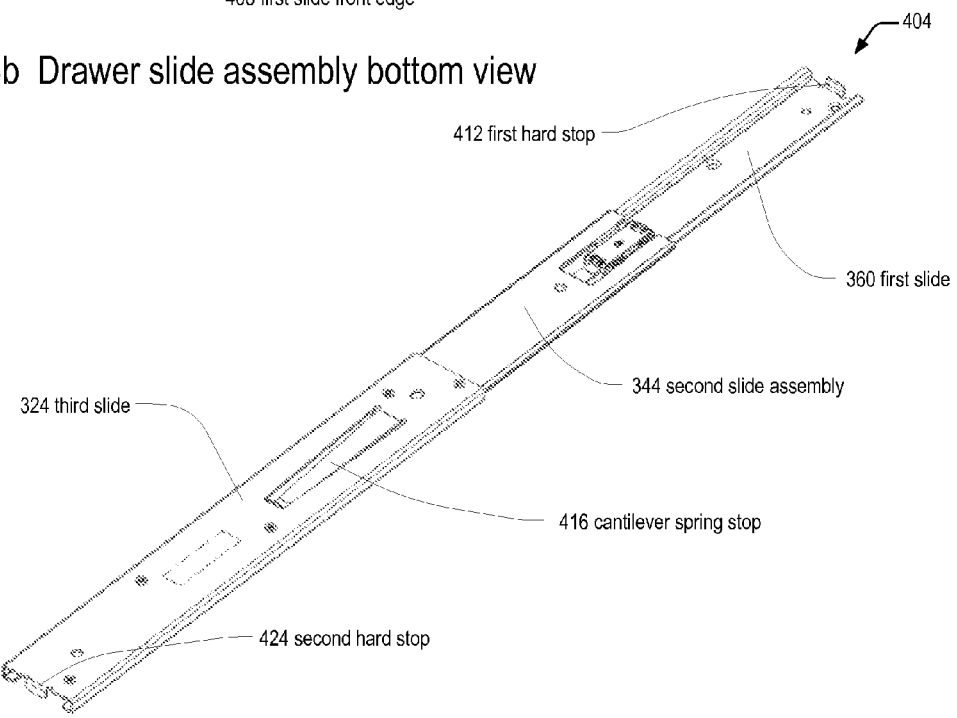

Fig. 4c First slide
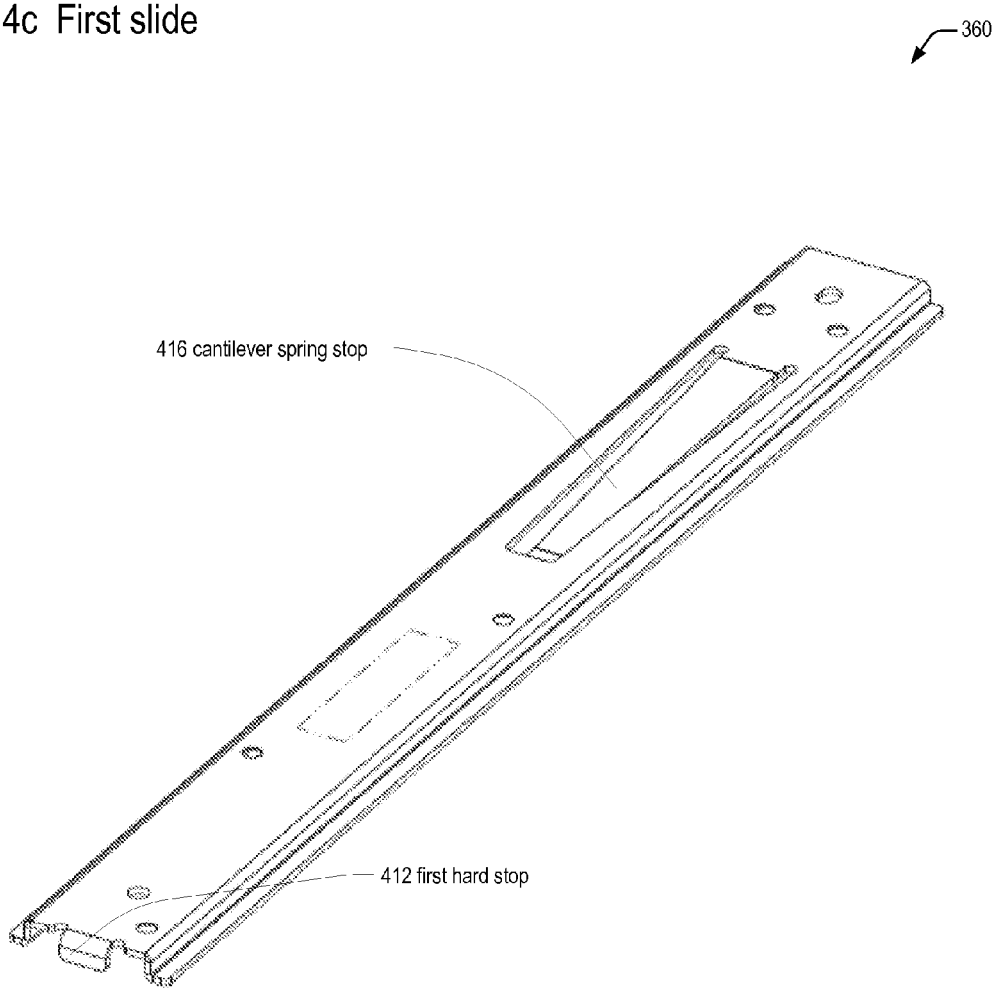

Fig. 4d Third slide
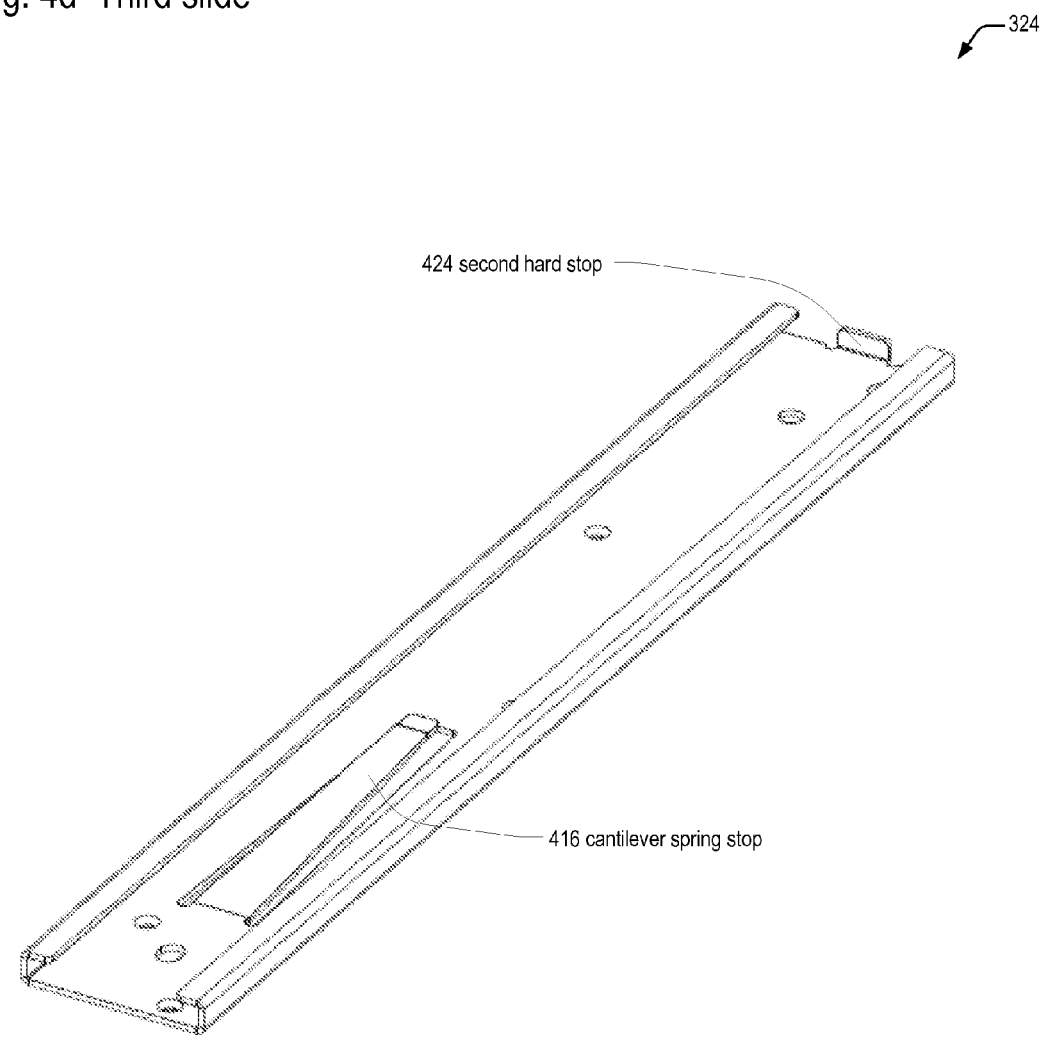

Fig. 4e  Second slide assembly
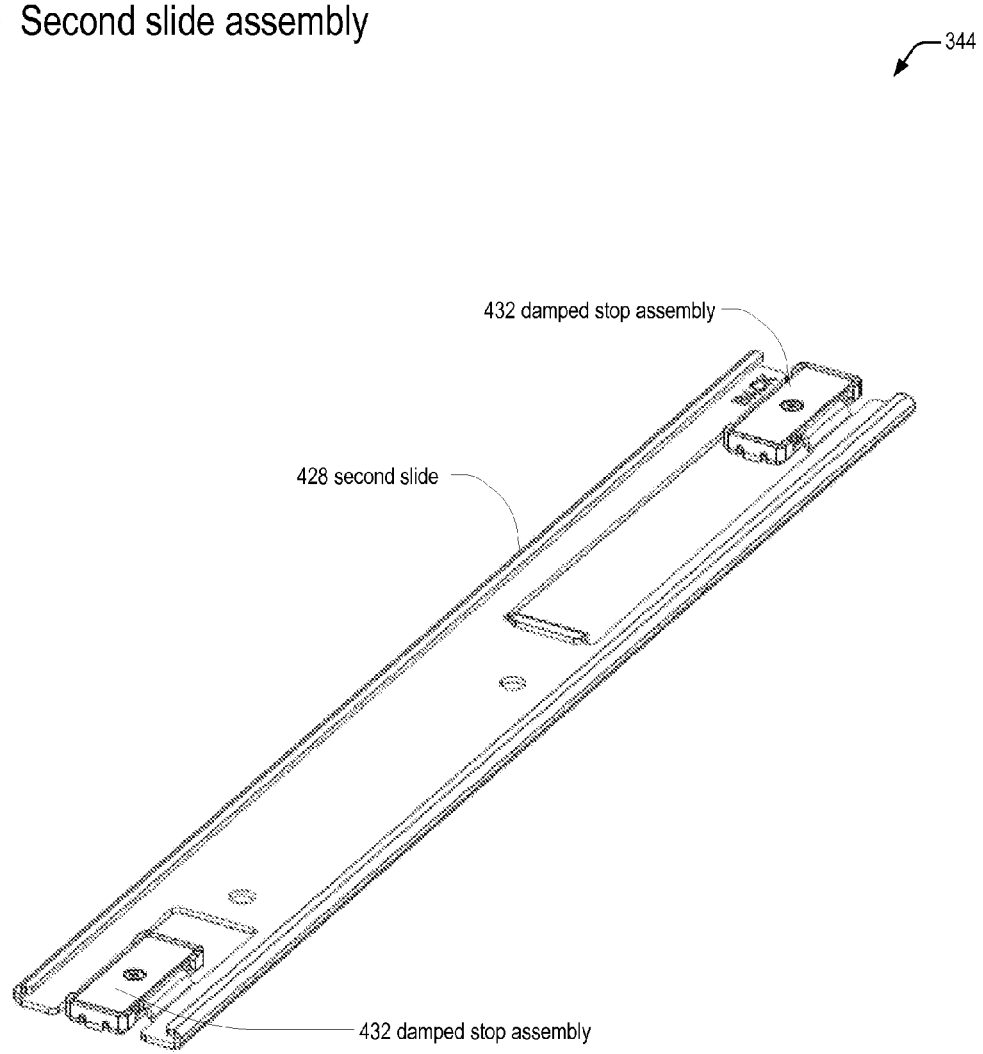

Fig. 4f Second slide
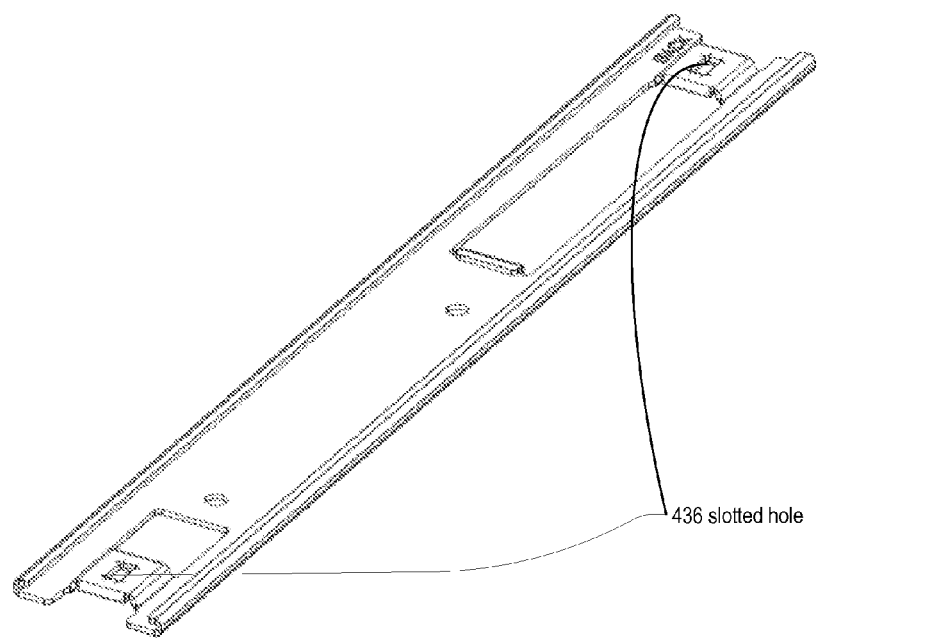

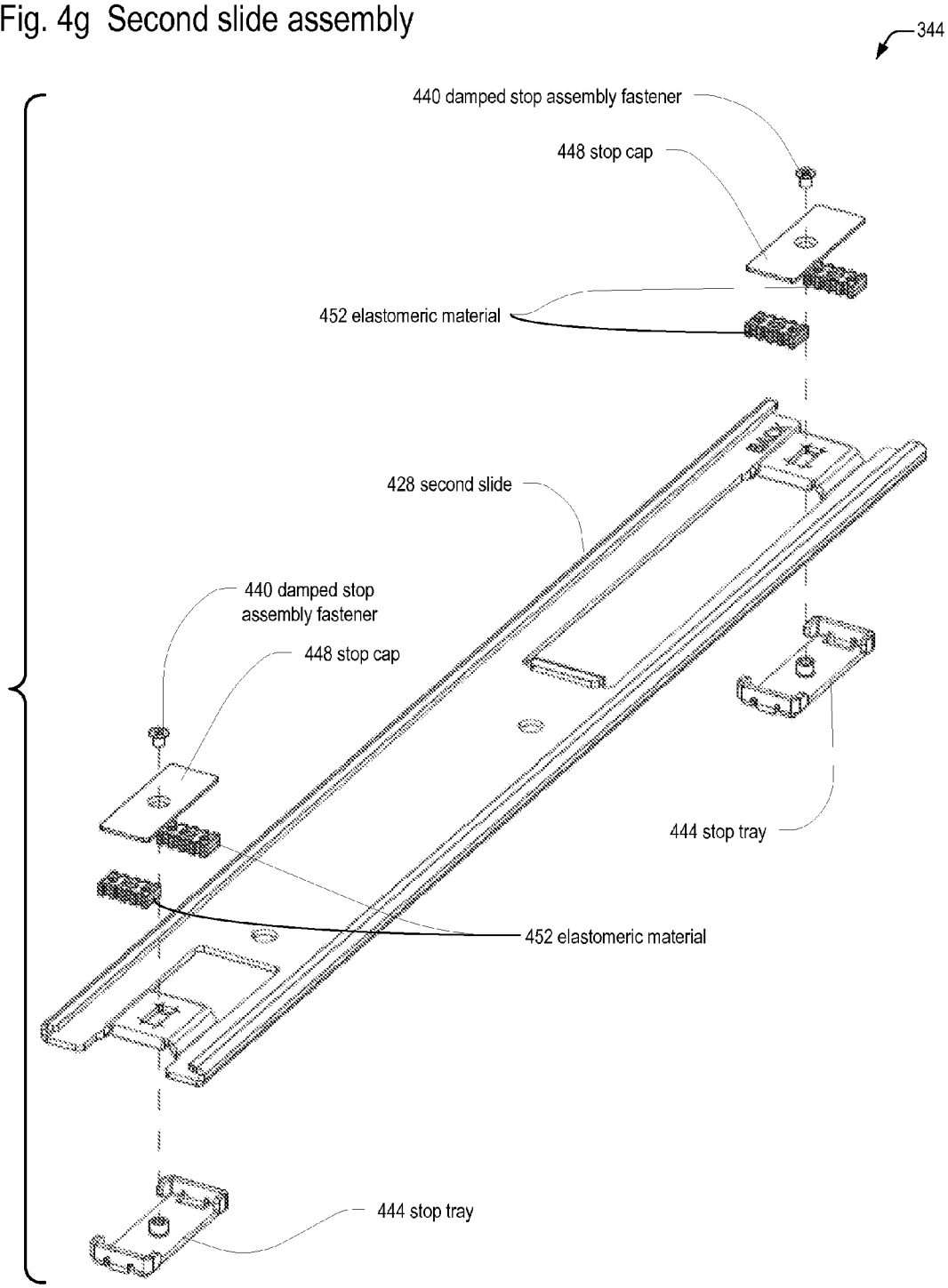
Fig. 4g Second slide assembly

Fig. 4h Stop tray
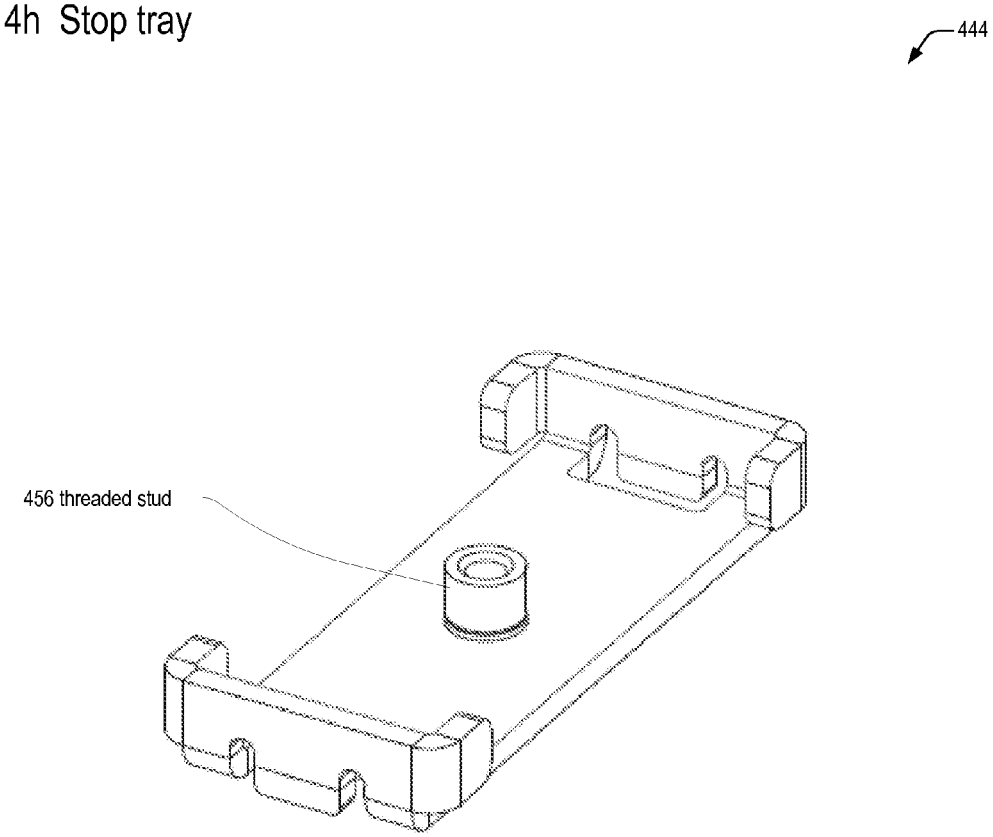

Fig. 4i Stop cap
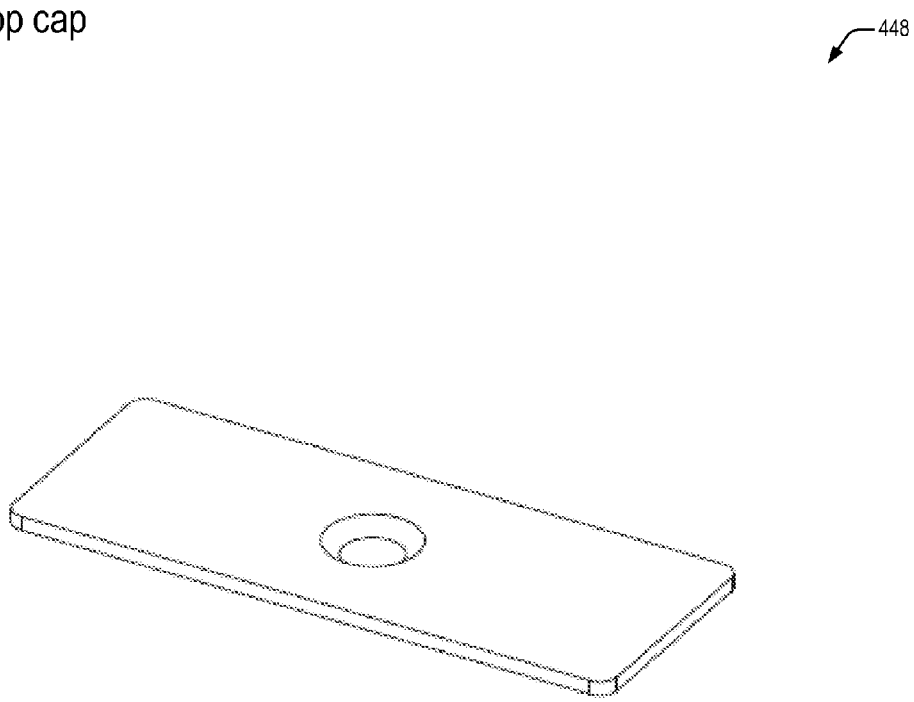

Fig. 4j Elastomeric material
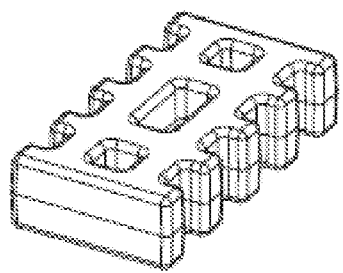
452

Fig. 4k  Damped stop assembly in uncompressed state
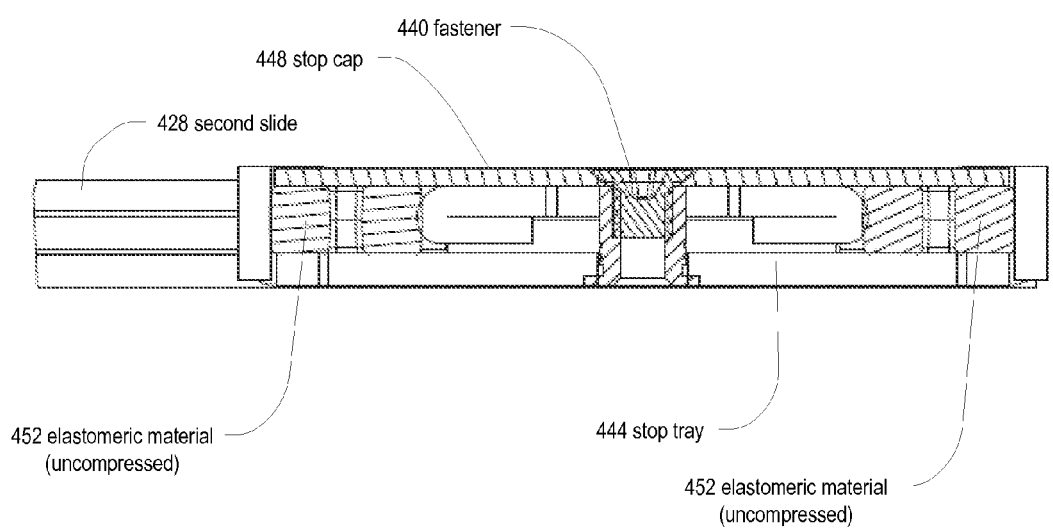

Fig. 4l Damped stop assembly in compressed state
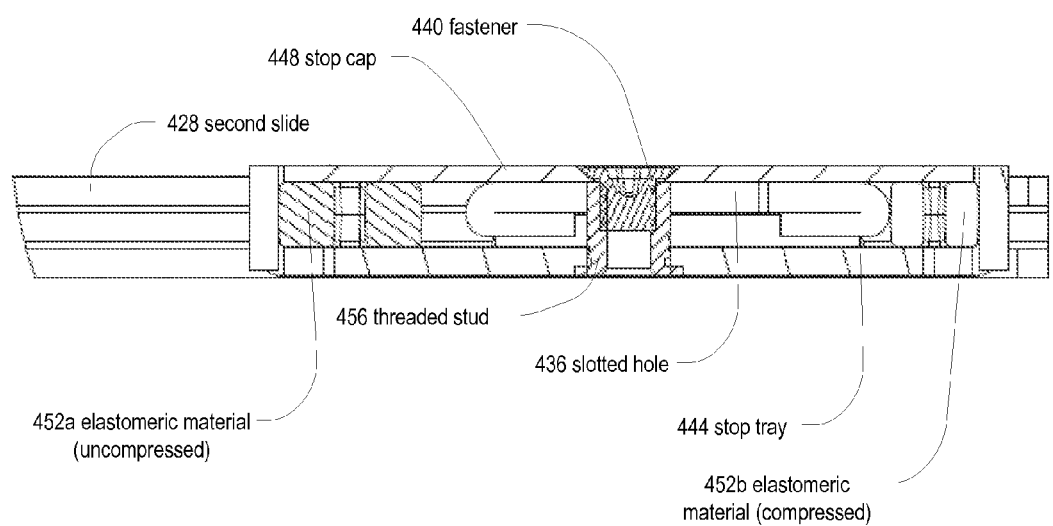

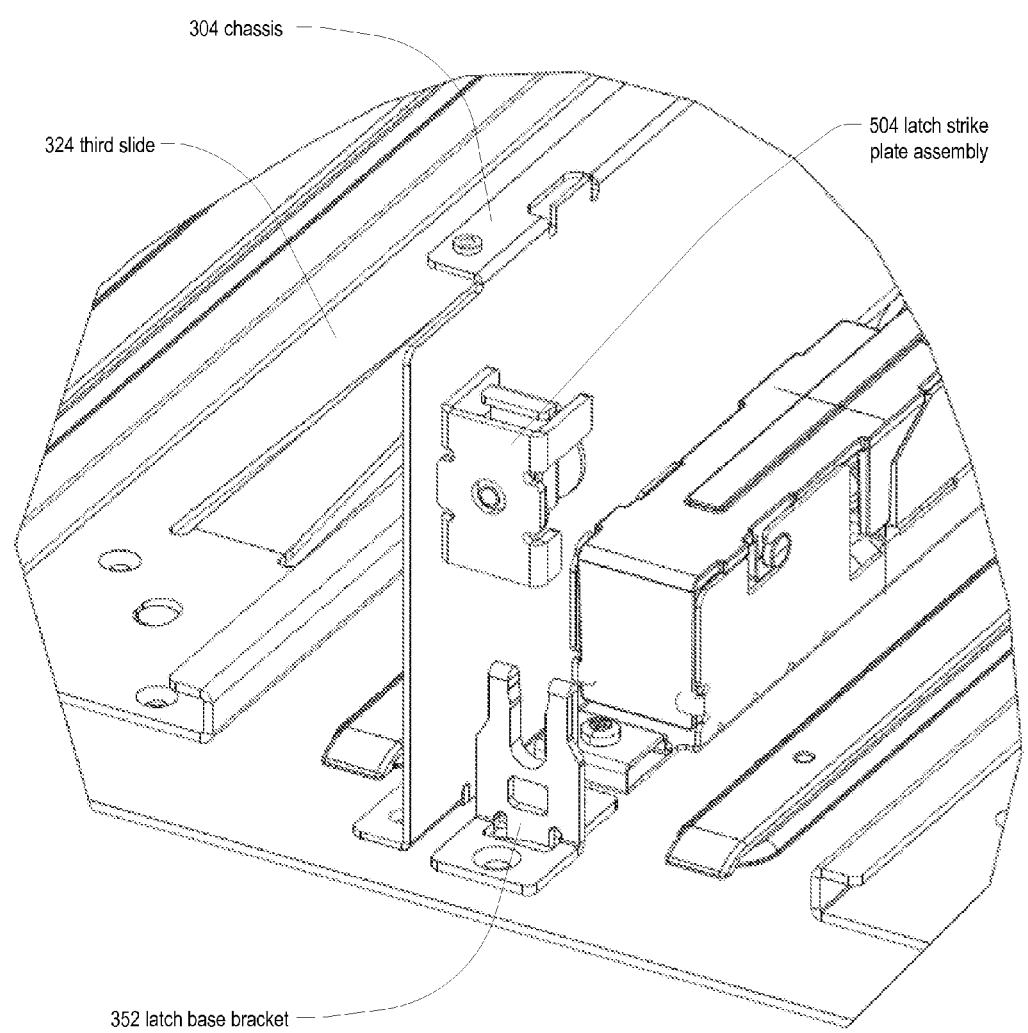
Fig. 5a Pre-installation drawer latch assembly

Fig. 5b Post-installation drawer latch assembly
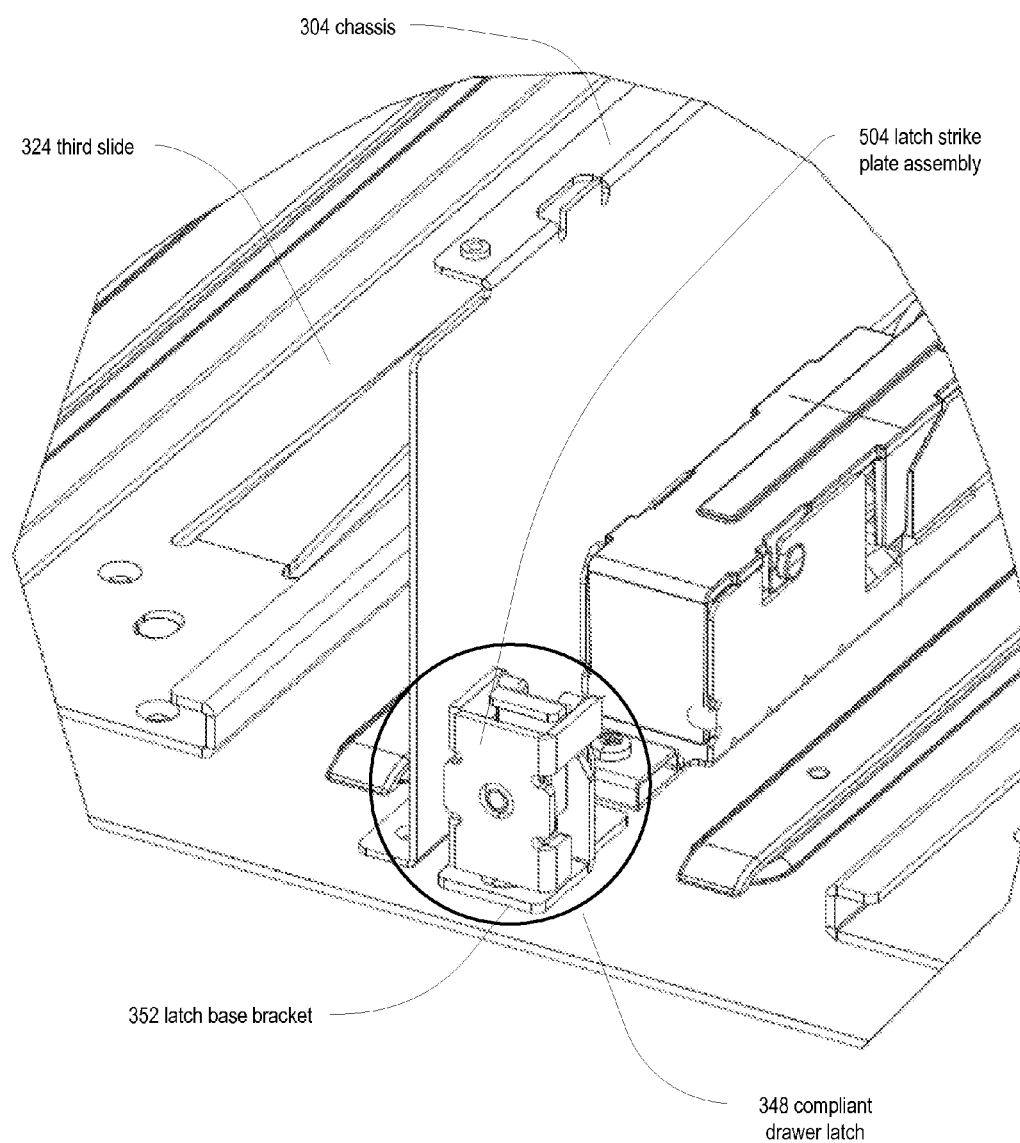

Fig. 5c Post-installation drawer latch assembly over-travel limit
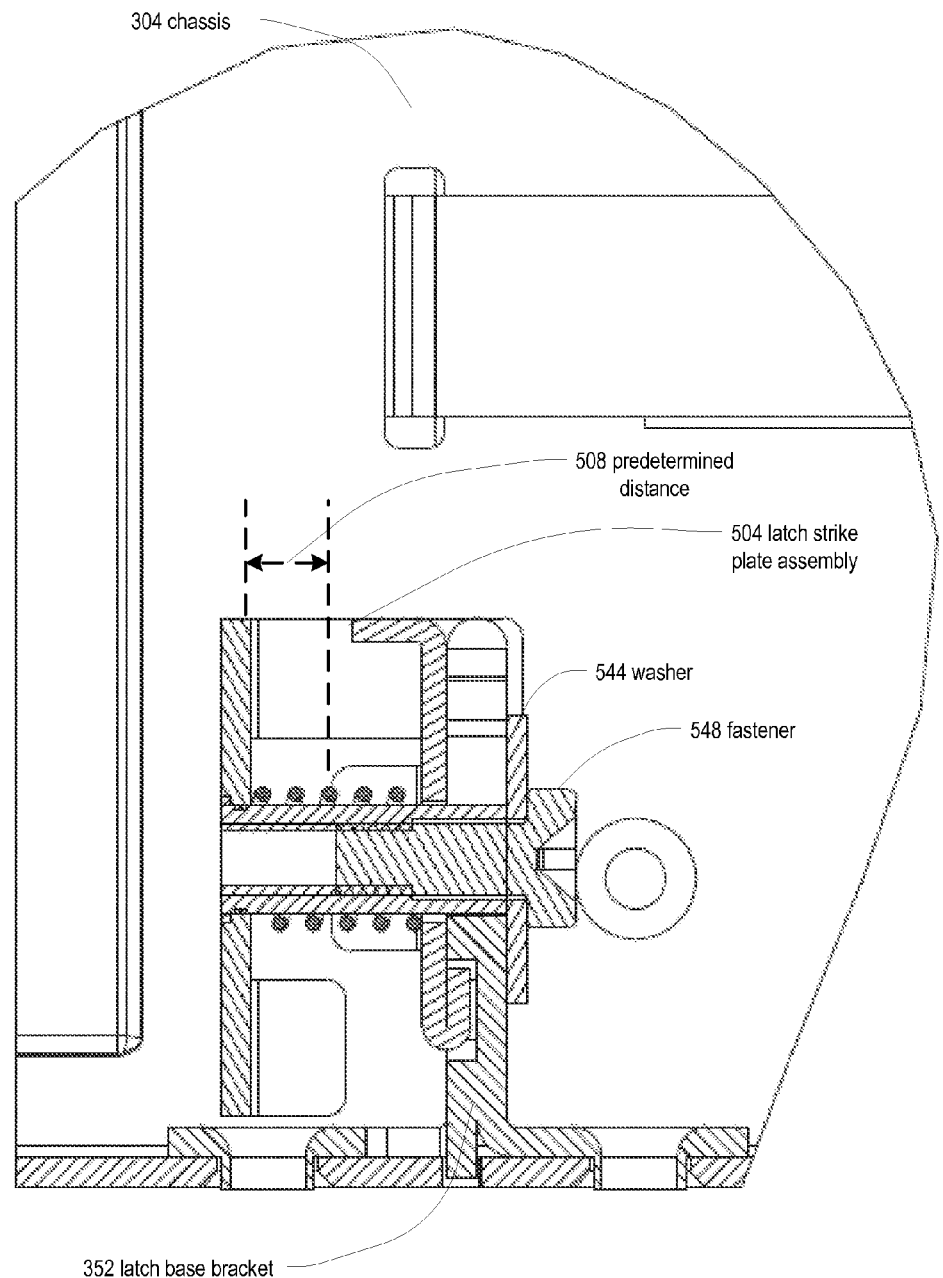

Fig. 5d  Latch base bracket
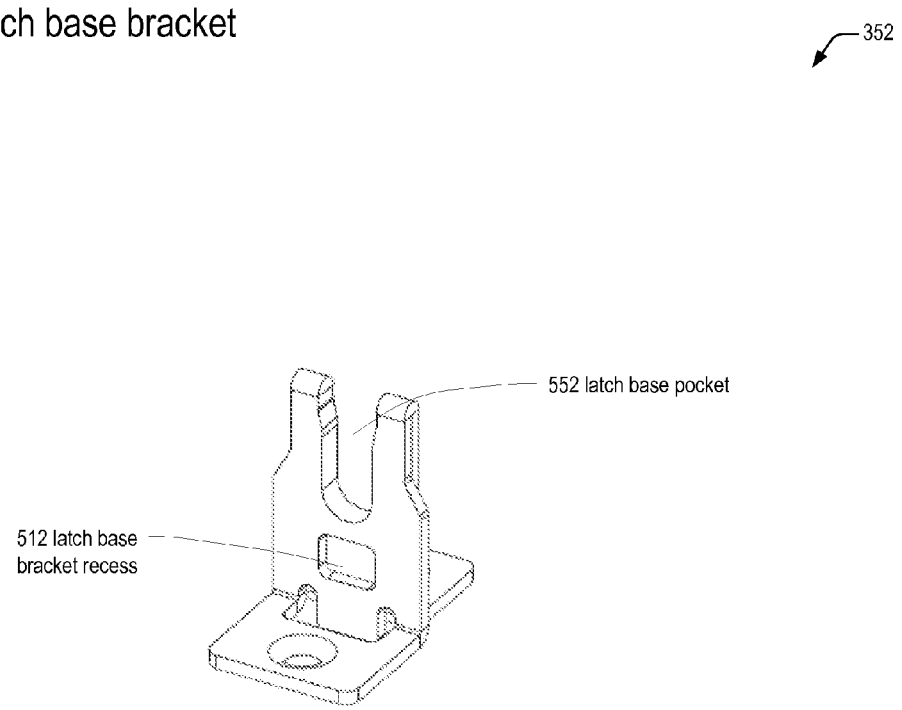

Fig. 5e Latch strike plate assembly
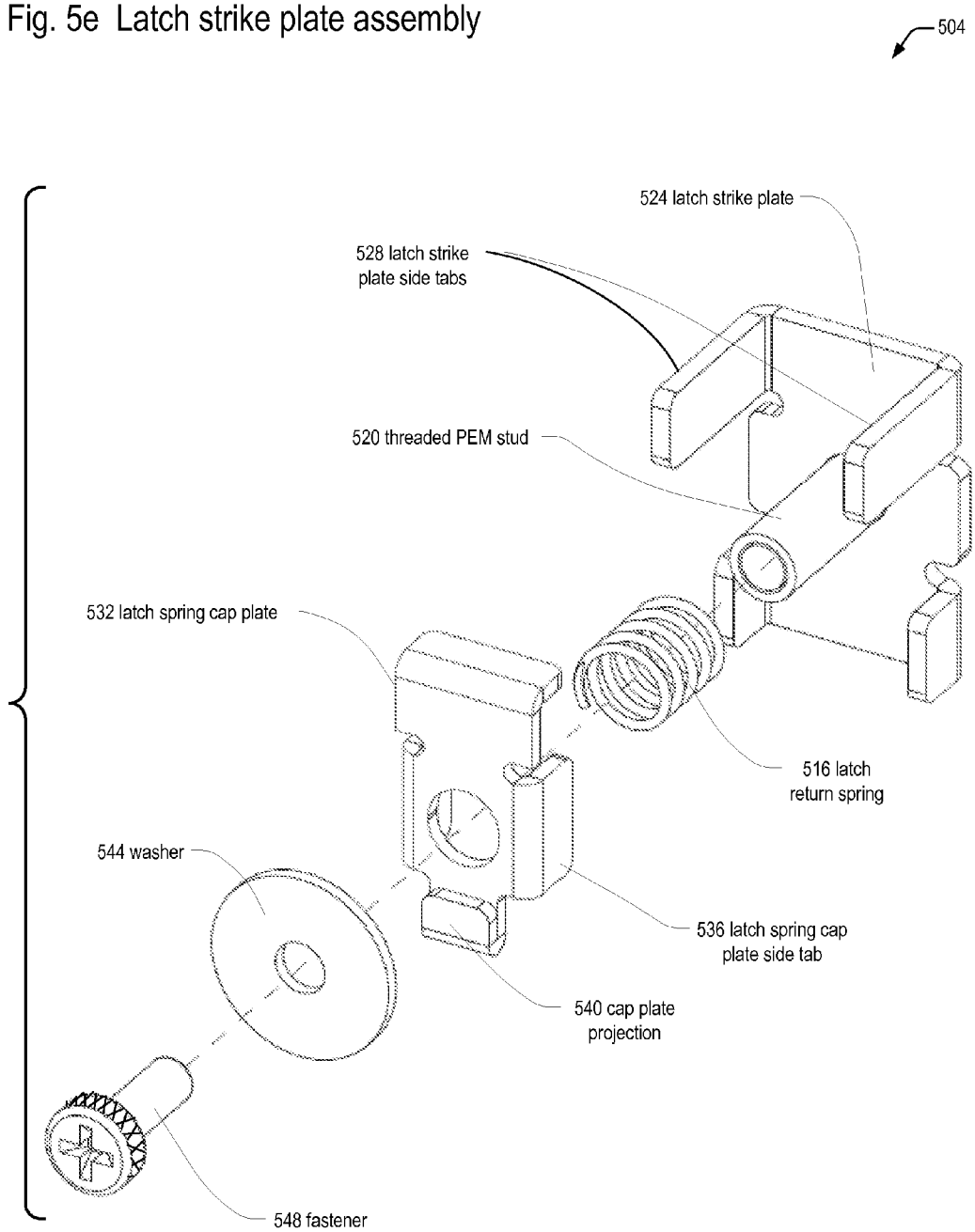

Fig. 5f Latch strike plate
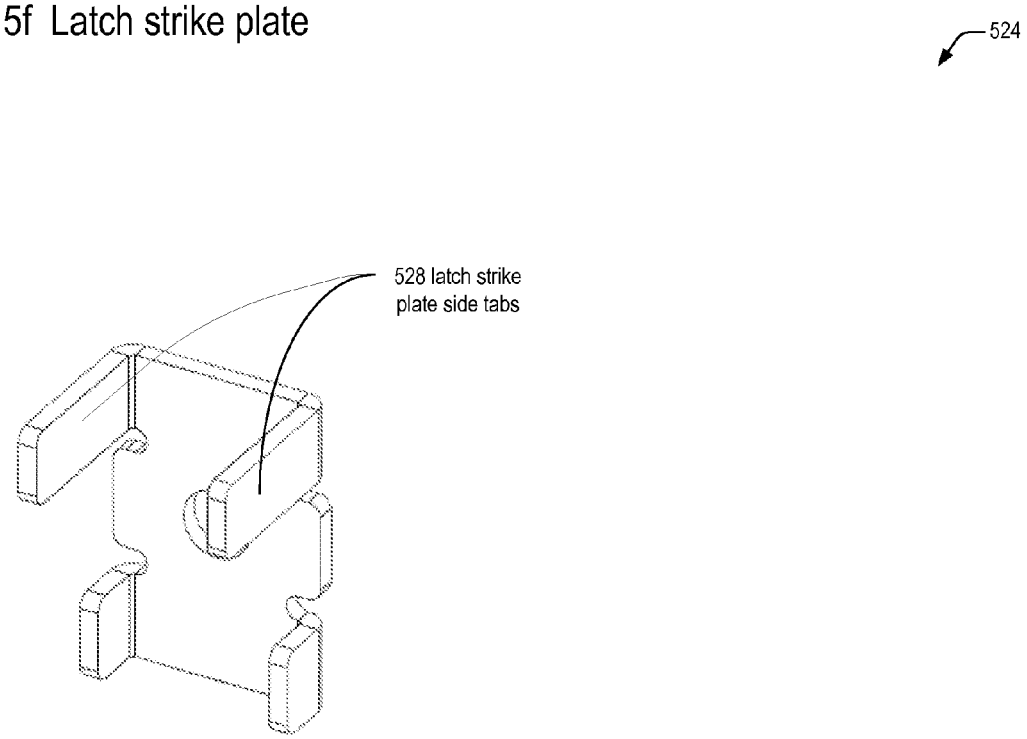

Fig. 5g  Latch spring cap plate
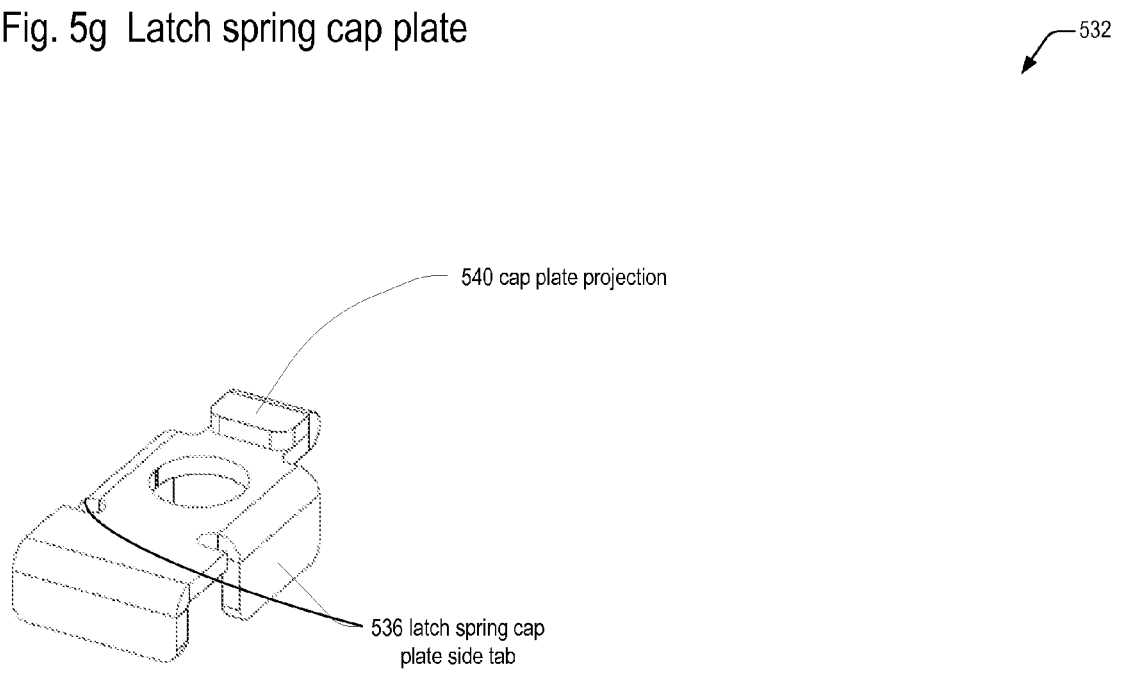

Fig. 5h Threaded PEM stud
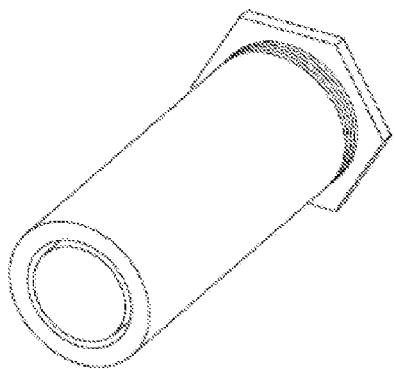
520

Fig. 5i Latch return spring
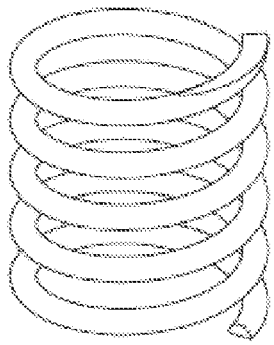
516

Fig. 5j Fastener
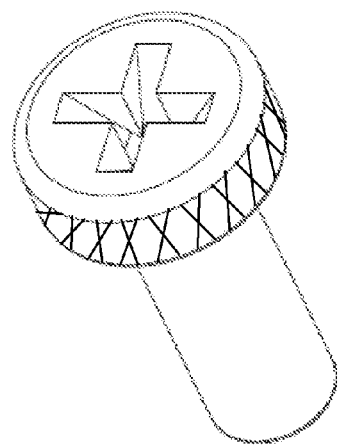

Fig. 5k Washer 544
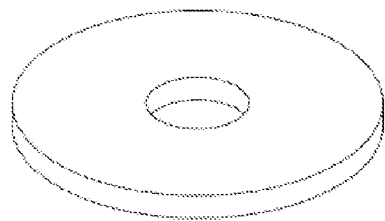

Fig. 5l Over-traveled drawer in contact with a compliant drawer latch
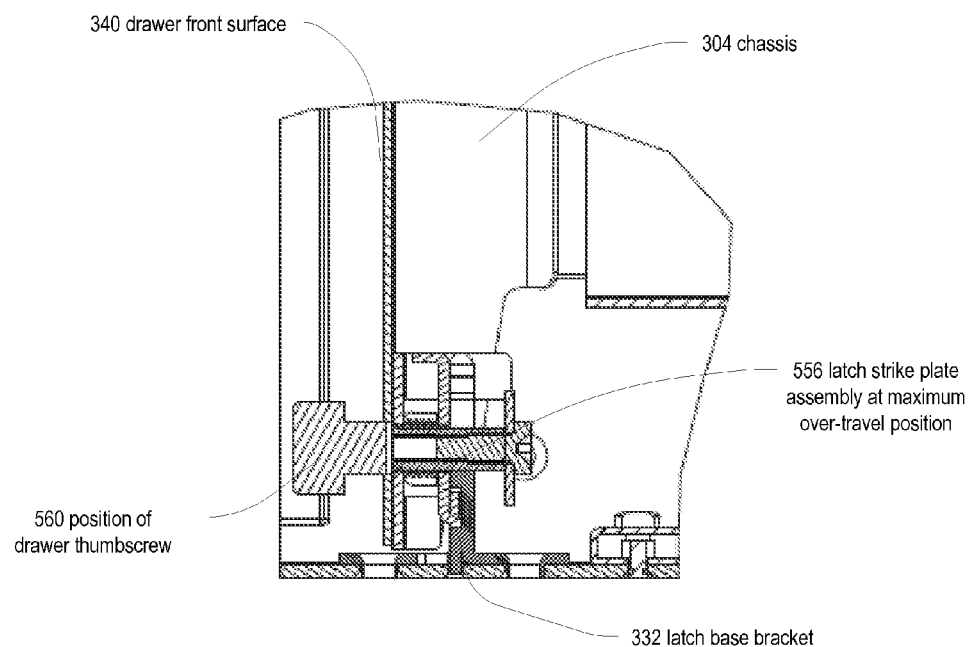

Fig. 5m Non-over-traveled drawer in contact with a compliant drawer latch and secured by a drawer thumbscrew
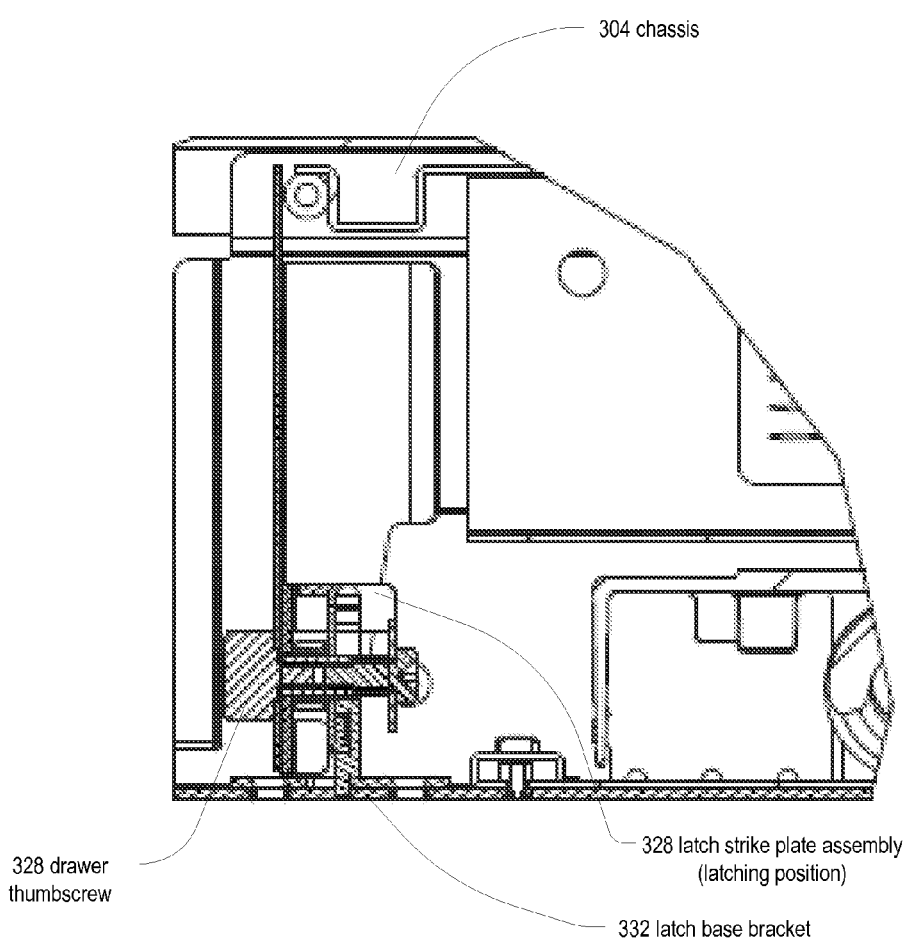

Fig. 5n Installation of a latch strike plate assembly to and from a latch base bracket
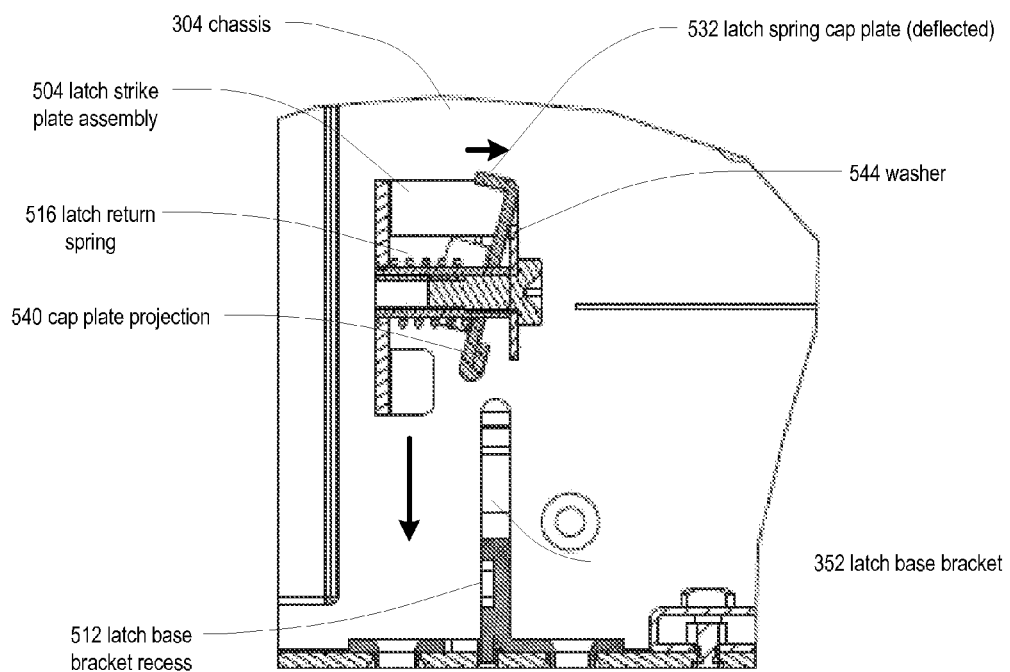

COMPLIANT DRAWER LATCH ASSEMBLY

CROSS REFERENCE TO RELATED APPLICATION(S)

This application claims the benefit of U.S. Provisional application Ser. No. 61/790,049 filed Mar. 15, 2013, entitled COMPLIANT DRAWER LATCH ASSEMBLY, which is hereby incorporated by reference for all purposes and which was owned or subject to an obligation of assignment to Dot Hill Systems Corporation at the time the invention claimed herein was made. This application is related to pending U.S. Non-Provisional application Ser. No. 14/100,053 filed Dec. 9, 2013, entitled SHOCK DAMPENING DRAWER SLIDE, pending U.S. Non-Provisional application Ser. No. 13/747,585 filed Jan. 23, 2013, entitled HIGH DENSITY DATA STORAGE SYSTEM WITH IMPROVED STORAGE DEVICE ACCESS, pending U.S. Non-Provisional application Ser. No. 13/747,609 filed Jan. 23, 2013, entitled STORAGE ENCLOSURE WITH INDEPENDENT STORAGE DEVICE DRAWERS, pending U.S. Non-Provisional application Ser. No. 13/747,623 filed Jan. 23, 2013, entitled SAFE RACKMOUNTABLE STORAGE ENCLOSURE, and pending U.S. Non-Provisional application Ser. No. 13/747,637 filed Jan. 23, 2013, entitled STORAGE DEVICE CARRIER FOR HIGH DENSITY STORAGE SYSTEM.

FIELD

The present invention is directed to mechanical drawer apparatuses. In particular, the present invention is directed to apparatuses for reducing shock when a drawer over-travels in a chassis, and returning the drawer to a latching position.

BACKGROUND

The need to store digital files, documents, pictures, images and other data continues to increase rapidly. In connection with the electronic storage of data, systems incorporating one or more data storage controllers have been devised. Storage controllers receive data read and write requests from host computers and control one or more physical storage devices to beneficially store or provide the requested data from/to the host computers.

In mass storage systems, storage devices are typically housed in a sheet metal chassis, which is often mounted in a standard 19" equipment rack. In this way, many such chassis can be mounted in a common rack, resulting in a highly efficient storage configuration. In many cases, each chassis has one or more slide-mounted drawers that pull out of the front of the chassis. The drawers provide access to the storage devices when the drawer is extended from the chassis. Slide assemblies generally consist of multiple telescoping metal channels or slide members. Separate channels of the slide assembly attach respectively to a side of a drawer and the chassis and telescope or slide with respect to each other to permit opening the drawer from the chassis while simultaneously supporting the drawer. For continuous availability and improved performance, it is desired to allow the storage devices to continue to operate while a drawer is opened or closed.

Use of drawer slides which are attachable to the inside walls of a chassis or cabinet for support of drawers that may be slidably pulled from the chassis or cabinet is well known. Typically, slide assemblies are constructed from two or more channels which telescopically lengthen or shorten in concert with an attached drawer. Drawers and/or slides include mechanical stop features to limit the maximum drawer travel out of or into the chassis or cabinet. Drawer stops prevent a drawer from over-traveling when extended and falling on the floor, or damaging other assemblies in the chassis when the drawer is fully pushed into the chassis or cabinet.

SUMMARY

The present invention is directed to solving disadvantages of the prior art. In accordance with embodiments of the present invention, a compliant drawer latch is provided. The compliant drawer latch includes a first portion affixed to an inside surface of a chassis, and a second portion coupled to the first portion. The second portion includes a latch strike plate, a latch spring cap plate, and a latch return spring arranged between the latch strike plate and the latch spring cap plate. A drawer contacts the latch strike plate when the drawer is seated in the chassis. When the drawer over-travels the latch strike plate compresses the latch return spring up to a predetermined distance, and the compressed latch return spring applies force to the latch strike plate to return the latch strike plate to a latching position when the drawer rebounds from over-travel.

In accordance with another embodiment of the present invention, a shock absorbing system for a sliding drawer is provided. The shock absorbing system includes a chassis, where the drawer moves relative to the chassis in a first direction when extending from the chassis and in a second direction when retracting into the chassis. The chassis includes a latch base bracket affixed to an inside surface of the chassis. The shock absorbing system also includes a latch strike plate assembly coupled to the latch base bracket. A drawer contacts the latch strike plate assembly when the drawer is seated in the chassis. When the drawer over-travels the latch strike plate assembly compresses up to a predetermined distance. The latch strike plate assembly installs and is removed from the latch base bracket without requiring tools.

An advantage of the present invention is it provides a resilient means to return an over-traveled storage device drawer to a latching position. By providing resilient contact instead of a hard stop when a drawer over-travels when closing, shock to storage devices and other assemblies in the drawer is reduced.

Another advantage of the present invention is it quickly returns an over-traveled drawer to a latching position, instead of rebounding off a hard stop past a latching position and requiring another manual drawer closing operation.

Yet another advantage of the present invention is it allows assembly and disassembly without requiring tools, simplifying service.

Additional features and advantages of embodiments of the present invention will become more readily apparent from the following description, particularly when taken together with the accompanying drawings.

BRIEF DESCRIPTION OF THE DRAWINGS

FIG. 1 is a block diagram illustrating components of a data storage network in accordance with embodiments of the present invention.

FIG. 2a is a block diagram illustrating components of a host-based or expansion data storage system in accordance with embodiments of the present invention.

FIG. 2b is a block diagram illustrating components of a non host-based data storage system in accordance with embodiments of the present invention.

FIG. 3a is a diagram illustrating components of a storage enclosure with a front bezel in accordance with embodiments of the present invention.

FIG. 3b is a diagram illustrating components of a storage enclosure without a front bezel in accordance with embodiments of the present invention.

FIG. 3c is a diagram illustrating components of a storage enclosure with a drawer extended in accordance with embodiments of the present invention.

FIG. 3d is a diagram illustrating storage device mounting in a drawer in accordance with embodiments of the present invention.

FIG. 3e is a diagram illustrating chassis components without drawers in accordance with embodiments of the present invention.

FIG. 3f is a diagram illustrating a partially assembled chassis in accordance with embodiments of the present invention.

FIG. 3g is a diagram illustrating a storage enclosure bottom view in accordance with embodiments of the present invention.

FIG. 4a is a diagram illustrating a drawer slide assembly top view in accordance with the preferred embodiment of the present invention.

FIG. 4b is a diagram illustrating a drawer slide assembly bottom view in accordance with the preferred embodiment of the present invention.

FIG. 4c is a diagram illustrating a first slide in accordance with the preferred embodiment of the present invention.

FIG. 4d is a diagram illustrating a third slide in accordance with the preferred embodiment of the present invention.

FIG. 4e is a diagram illustrating a second slide assembly in accordance with the preferred embodiment of the present invention.

FIG. 4f is a diagram illustrating a second slide in accordance with the preferred embodiment of the present invention.

FIG. 4g is a diagram illustrating an exploded view of the second slide assembly in accordance with the preferred embodiment of the present invention.

FIG. 4h is a diagram illustrating a stop tray in accordance with the preferred embodiment of the present invention.

FIG. 4i is a diagram illustrating a stop cap in accordance with the preferred embodiment of the present invention.

FIG. 4j is a diagram illustrating an elastomeric material in accordance with the preferred embodiment of the present invention.

FIG. 4k is a diagram illustrating a damped stop assembly in an uncompressed state in accordance with embodiments of the present invention.

FIG. 4l is a diagram illustrating a damped stop assembly in a compressed state in accordance with embodiments of the present invention.

FIG. 5a is a diagram illustrating a pre-installation drawer latch assembly in accordance with embodiments of the present invention.

FIG. 5b is a diagram illustrating a post-installation drawer latch assembly in accordance with embodiments of the present invention.

FIG. 5c is a diagram illustrating a post-installation drawer latch assembly over-travel limit in accordance with embodiments of the present invention.

FIG. 5d is a diagram illustrating a latch base bracket in accordance with the preferred embodiment of the present invention.

FIG. 5e is a diagram illustrating an exploded view of a latch strike plate assembly in accordance with the preferred embodiment of the present invention.

FIG. 5f is a diagram illustrating a latch strike plate in accordance with the preferred embodiment of the present invention.

FIG. 5g is a diagram illustrating a latch spring cap plate in accordance with the preferred embodiment of the present invention.

FIG. 5h is a diagram illustrating a threaded PEM stud in accordance with the preferred embodiment of the present invention.

FIG. 5i is a diagram illustrating a latch return spring in accordance with the preferred embodiment of the present invention.

FIG. 5j is a diagram illustrating a fastener in accordance with the preferred embodiment of the present invention.

FIG. 5k is a diagram illustrating a washer in accordance with the preferred embodiment of the present invention.

FIG. 5l is a diagram illustrating an over-traveled drawer in contact with a compliant drawer latch in accordance with the preferred embodiment of the present invention.

FIG. 5m is a diagram illustrating a non over-traveled drawer in contact with a compliant drawer latch and secured by a drawer thumbscrew in accordance with the preferred embodiment of the present invention.

FIG. 5n is a diagram illustrating installation of a latch strike plate assembly to and from a latch base bracket, respectfully, in accordance with the preferred embodiment of the present invention.

DETAILED DESCRIPTION

The present invention is directed to improvements to securely latching a storage device drawer while reducing imparted shock to operating storage devices in the drawer. In the conventional art, a hard stop in a storage chassis would prevent a drawer from over-traveling when the drawer was seated within the storage chassis or extended from a storage chassis. Such a hard stop prevents a drawer from over-traveling and possibly damaging a chassis midplane, power supplies, or other electronic assemblies behind and in the interior of the storage chassis. However, a hard stop has certain disadvantages.

One disadvantage of a hard stop is it causes a drawer to rebound after making contact with the hard stop. Drawers may contain a large number of storage devices and other assemblies, resulting in a relatively high mass. Drawers with a higher mass will rebound a further distance from the chassis. It is desirable for a drawer to return to a latching position after over-traveling, rather than rebounding outward past a latching position and requiring one or more additional drawer closing operations.

Another disadvantage of a hard stop is the shock imparted generally to a storage chassis and specifically to storage devices. It is well understood in the art that shock events may result in various adverse effects to a storage system, including temporary pause of data flow, certain forms of data corruption, and in extreme cases damage to storage devices and/or loss of data. What is needed is an apparatus to reduce or mitigate severe shock events when fully opening or closing drawers in a storage chassis or enclosur.

Referring now to FIG. 1, a block diagram illustrating components of a data storage network 100 in accordance with embodiments of the present invention is shown. Data storage network 100 provides interconnection between one or more host computers 108 and one or more storage enclosures 112. Network 104 includes networking communication technologies suitable for high-volume data transfers between host computers 108 and storage enclosures 112. Such technologies include Fiber Channel, Ethernet, SSA, SAS, iSCSI, Infiniband, ESCON, and FICON. Network 104 includes, but is not limited to local area networks (LANs) and storage area networks (SANs).

Host computers 108 execute application programs, and communicate with other host computers 108 or storage enclosures 112 through network 104. Storage enclosures 112 include storage devices that provide mass data storage. Storage devices include hard disk drives, tape drives, optical drives, and solid state drives. In some embodiments, data storage network 100 includes one or more management computers 116. Management computers 116 monitor network 104, and provide error monitoring, configuration, and control functions. In most embodiments, management computer 116 includes a graphical user interface (GUI) 120, through which users or system administrators interact with management computer 116. In some embodiments, management computer 116 interfaces with storage enclosures 112 through network 104. In other embodiments, management computer 116 interfaces with storage enclosures 112 through a different connection or network other than network 104. Although three host computers 108a, 108b, 108c and three storage enclosures, 112a, 112b, 112c are shown in FIG. 1, network 104 includes any number of host computers 108 and storage enclosures 112.

Referring now to FIG. 2a, a block diagram illustrating components of a host-based or expansion data storage system 200 in accordance with embodiments of the present invention is shown.

The data storage system 200 includes one or more host computers 108. Host computer 108 is generally a server, but could also be a desktop or mobile computer. Host computer 108 executes application programs that generate read and write requests to a storage controller 204 within the host computer 108. In some embodiments, storage controller 204 is a host bus adapter or storage controller card in host computer 108. In other embodiments, storage controller 204 is a combination of an I/O controller often on a motherboard of host computer 108 and software applications running on one or more processors of host computer 108. Storage controller 204 communicates with storage devices 208 in a drawer 212 of JBOD storage enclosure 216 over host bus or network 104. Host bus or network 104 in one embodiment is a bus such as SCSI, FC-AL, USB, Firewire, SSA, SAS, SATA, or Infiniband. In another embodiment, host bus or network 104 is a network such as Ethernet, iSCSI, Fiber Channel, SSA, ESCON, ATM, FICON, or Infiniband.

Host computer 108 interfaces with one or more storage controllers 204, although only a single storage controller 204 is illustrated for clarity. In one embodiment, storage controller 204 is a RAID controller. In another embodiment, storage controller 204 is a storage appliance such as a provisioning, virtualization, replication, or backup appliance. Storage controller 204 transfers data to and from storage devices 208a-208z in drawer 212 of JBOD storage enclosure 216.

JBOD Storage enclosure 216 in one embodiment contains 48 storage devices 208, with 16 storage devices 208 in each of three drawers 212. In other embodiments, JBOD Storage enclosure 216 may contain fewer or more than 48 storage devices 208. Storage devices 208 include various types of storage devices, including hard disk drives, solid state drives, optical drives, and tape drives. Within a specific storage device 208 type, there may be several sub-categories of storage devices 208, organized according to performance. For example, hard disk drives may be organized according to cache size, drive RPM (5,400, 7,200, 10,000, and 15,000, for example), queue depth, random transfer rate, or sequential transfer rate.

Referring now to FIG. 2b, a block diagram illustrating components of a non host-based data storage system 220 in accordance with embodiments of the present invention is shown. Non host-based data storage system 220 is similar to host-based or expansion data storage system 200, with the exception being storage controller 204 is within storage enclosure 224, along with storage devices 208. In the embodiment illustrated in FIG. 2b, storage controller 204 is a single RAID controller 204. However, in other embodiments, storage controller 204 represents multiple RAID or other storage controllers 204.

Referring now to FIG. 3a, a diagram illustrating components of a storage enclosure 216, 224 with a front bezel 320 in accordance with embodiments of the present invention is shown. Storage enclosure 216, 224 is a sheet metal enclosure including a chassis 304 including one or more drawers that mount storage devices 208. Storage enclosure 216, 224 includes one or more power supplies that provide DC power to storage devices and other circuits. Storage enclosure 216, 224 includes a chassis top surface 308, a chassis bottom surface 312, and two chassis side surfaces 316. In many embodiments, storage enclosure 216, 224 includes a front bezel 320 that provides an improved aesthetic appearance and identification of the manufacturer or branding. The front bezel 320 covers the drawers 212 containing the storage devices 208, and must be removed in order to access the drawers 212 or storage devices 208.

Referring now to FIG. 3b, a diagram illustrating components of a storage enclosure 216, 224 without a front bezel 320 in accordance with embodiments of the present invention is shown. Front bezel 320 is typically attached by ball studs or other means that do not require tools to snap the front bezel 320 on or off the chassis 304. After removing a front bezel 320, one or more drawers 212 may be accessed. Each drawer 212 may house up to a predetermined number of storage devices 208, and drawers 212 have drawer pulls on the front surface that allow a user to pull a drawer 212 out the front of the chassis 304. Drawers 212 may have one or more visual or audible indicators that provide useful status information, including power on/off, drawer 212 operating/non-operating, or fault.

Referring now to FIG. 3c, a diagram illustrating components of a storage enclosure 216, 224 with a drawer 212 extended in accordance with embodiments of the present invention is shown. Each drawer 212 can mount a number of storage devices 212. In one embodiment, each drawer 212 can mount up to 16 storage devices 208. Each drawer 212 is extended from the chassis 304 in a first direction 332 to access the storage devices 208 or other circuits or assemblies within a drawer 212. A third slide 324 is affixed to an inside surface of the chassis 304 to allow the drawer 212 to be extended or retracted to or from the chassis 304. Third slide 324 will be discussed in more detail in conjunction with drawer 212 and other assemblies in other drawings herein. Each drawer 212 has an associated drawer thumbscrew 328, or second threaded fastener, to secure the drawer 212 in a latching position to the chassis 304. Once a drawer 212 is secured, it may not be extended from the chassis 304 until the corresponding drawer thumbscrew 328 is disengaged from latching hardware in the chassis 304. In the preferred embodiment, drawer thumbscrews 328 may be engaged and disengaged to and from latching hardware in the chassis 304 without the use of tools.

Referring now to FIG. 3d, a diagram illustrating storage device 208 mounting in a drawer 212 in accordance with embodiments of the present invention is shown. Drawer 212 pulls out from the front of chassis 304, and each drawer 212 includes a drawer front surface 340 and a drawer rear surface 336. Each drawer 212 mounts a predetermined number of storage devices 208, which may be individually inserted or removed from the drawer 212 when the drawer 212 is extended. In the embodiment illustrated in FIG. 3d, there are up to 16 storage devices 208 mounted in a drawer 212, and all storage devices 208 are inserted or removed from the drawer 212 from the same side. As can be appreciated by one of skill in the art, it may be necessary to pull the drawer 212 all the way out from the chassis 304 in order to access the leftmost storage devices 208 in the drawer 212. Although 16 side-accessible storage devices 208 are illustrated in FIG. 3d, the present invention is not limited to any number of storage devices 208 or storage device 208 orientations. Therefore, the present invention is equally applicable to any storage device drawer 212 arrangement, including top access, front access, side access, or bottom access, as well as any number of supported storage devices 208.

Referring now to FIG. 3e, a diagram illustrating chassis 304 components without drawers 212 in accordance with embodiments of the present invention is shown. FIG. 3e illustrates various elements and features of the present invention more clearly, without drawers 212 obscuring the elements and features.

For each drawer 212 in chassis 304 there are supporting features that provide shock reduction and improved ergonomics over conventional art chassis. Each drawer 212 has a corresponding compliant drawer latch 348. Compliant drawer latches 348 are secured to an inside surface of the chassis 304, and contact a surface of the drawer 212 when the drawer 212 is either closed or being closed. In the embodiment illustrated in FIG. 3e, compliant drawer latches 348 are mounted near a front inside surface of chassis 304 and make contact with an inside surface of drawer front surface 340. However, in other embodiments compliant drawer latches 348 may instead make contact with other drawer 212 surfaces, including a drawer rear surface 336. Details of compliant drawer latches 348 are shown and described in more detail with respect to FIGS. 5a-5n.

Each drawer 212 in chassis 304 also has an associated second slide assembly 344, which is part of a drawer slide assembly which supports each drawer 212 as the drawer 212 is extended from or retracted into the chassis 304. FIG. 3e illustrates a left side second slide assembly 344 in an extended position, and a center and right side second slide assembly 344 in a retracted position. The extended drawer position corresponds to the left drawer 212 shown in FIG. 3c and the retracted drawer position corresponds to the center or right drawers 212 shown in FIG. 3c. The drawer slide assemblies are shown and described in more detail with respect to FIGS. 4a-4l.

Referring now to FIG. 3f, a diagram illustrating a partially assembled chassis 304 in accordance with embodiments of the present invention is shown. Partially assembled chassis 304 is a simplified view from FIG. 3e, with an electronics midplane and other assemblies of the chassis 304 not shown. Third slide 324 is affixed to the inside bottom surface of chassis 304, and is visible in the left drawer position when the second slide assembly 344 is extended. The third slide 324 is slidingly engaged to the bottom of the second slide assembly 344.

Also visible in FIG. 3f are latch base brackets 352, corresponding to and part of each compliant drawer latch 348. Each latch base bracket 352 is fastened to the inside bottom surface of chassis 304, and is shown and described in more detail with respect to FIG. 5d.

Referring now to FIG. 3g, a diagram illustrating a storage enclosure 216, 224 bottom view in accordance with embodiments of the present invention is shown. Chassis 304 has a chassis bottom surface 356. Each drawer 212 has a corresponding first slide 360 fastened to a bottom surface of the drawer 212. The first slide 360 is slidingly engaged to the top of the second slide assembly 344 when installed in the chassis 304, and retracts in a second direction 368 when pushing the drawer 212 into the chassis 304.

Referring now to FIG. 4a, a diagram illustrating a drawer slide assembly 404 top view in accordance with the preferred embodiment of the present invention is shown. Drawer slide assembly 404 includes first slide 360, second slide assembly 344, and third slide 324. First slide 360 is fastened to the bottom surface of a drawer 212 by any suitable fastening means, including but not limited to rivets, screws, or weld bonds. First slide 360 has a first slide front edge 408 that is oriented toward the front of a drawer 212. Third slide 324 is fastened to an inside surface of chassis 304 with similar fastening means as first slide 360. Third slide 324 has a third slide rear edge 420 that is oriented toward the center of chassis 304.

Second slide assembly 344 is captured within formed rails of third slide 324, and first slide 360 is captured within formed rails of second slide assembly 344. This allows the drawer slide assembly 404 to telescope outward when a drawer 212 is extended from the chassis 304, and telescope inward when a drawer 212 is retracted or pushed into the chassis 304. It should be noted that an alternative drawer slide assembly 404 may include a second slide assembly 344 that telescopes within a first slide 360, and a third slide 324 that telescopes within the second slide assembly 344.

Drawer slide assembly 404 also includes cantilever spring stops 416. Cantilever spring stops 416 keep each of the three slides 324, 344, 360 together when drawer slide assembly 404 is assembled, and provide stops that limit maximum drawer 212 extension from the chassis 304. Cantilever spring stops 416 also allow the first 360 and third 324 slides of drawer slide assembly 404 to be assembled and disassembled with the second slide assembly 344 without requiring tools.

Although a three-slide system is illustrated in the Figures, it should be appreciated that the present invention is not limited to a three-slide system and may be used in a slide system using two or more slides.

Referring now to FIG. 4b, a diagram illustrating a drawer slide assembly 404 bottom view in accordance with the preferred embodiment of the present invention is shown. FIG. 4b illustrates a first hard stop 412 at the first slide front edge 408, and a second hard stop 424 at the third slide rear edge 420. The first hard stop 412 and second hard stop 424 provide a limit to the collapsed length of drawer slide assembly 404. The two cantilever spring stops 416 provide a limit to the expanded length of drawer slide assembly 404.

Referring now to FIG. 4c, a diagram illustrating a first slide 360 in accordance with the preferred embodiment of the present invention is shown. Key dimensions in millimeters are shown only as a guide and representation of working dimensions for the preferred embodiment. First slide 360 is fastened to the bottom surface of drawer 212. First slide 360 includes first hard stop 412 and a cantilever spring stop 416, as well as mounting holes to fasten to the bottom of drawer 212. First slide 360 in the preferred embodiment is manufactured from a single section of cold rolled steel. Cantilever spring stop 416 is bent away from the main surface of first slide 360, and the role of cantilever spring stop 416 in reducing shock to storage devices 208 is described with respect to the accompanying drawings. In the preferred embodiment, cantilever spring stops 416 are 19 mm wide by 110 mm long, and have a deflection if approximately 4.5 mm.

Referring now to FIG. 4d, a diagram illustrating a third slide 324 in accordance with the preferred embodiment of the present invention is shown. Key dimensions in millimeters are shown only as a guide and representation of working dimensions for the preferred embodiment. Third slide 324 includes second hard stop 424 and a cantilever spring stop 416, as well as mounting holes to fasten to the inside surface of chassis 304. Third slide 324 in the preferred embodiment is manufactured from a single sheet metal section. Cantilever spring stop 416 is bent away from the main surface of third slide 324, and the role of cantilever spring stop 416 in reducing shock to storage devices 208 is described with respect to the accompanying drawings. In the preferred embodiment, cantilever spring stops 416 are 19 mm wide by 110 mm long, and have a deflection if approximately 4.5 mm.

Referring now to FIG. 4e, a diagram illustrating a second slide assembly 344 in accordance with the preferred embodiment of the present invention is shown. Second slide assembly 344 includes a second slide 428 as well as two damped stop assemblies 432 oriented toward the ends of second slide assembly 344. Damped stop assemblies 432 provide shock relief to the drawer 212 when fully extending or closing a drawer 212.

When fully extending a drawer 212, the end of each of the cantilever spring stops 416 makes contact with an inside edge of a damped stop assembly 432. This is shown in FIGS. 4a and 4b. The damped stop assemblies 432 then provide shock relief to the drawer 212, as described with respect to FIGS. 4g, 4k, and 4l. When fully closing a drawer 212, first hard stop 412 makes contact with an outside edge of one damped stop assembly 432 and second hard stop 424 makes contact with an outside edge of the other damped stop assembly 432 of the same second slide assembly 344. When a drawer 212 is secured by a drawer thumbscrew 328 to a latch strike plate assembly 504, each damped stop assembly 432 is compressed approximately 1 mm.

For a three slide drawer slide assembly 404 including first slide 360, second slide assembly 344, and third slide 324, two damped stop assemblies 432 would be used for each second slide assembly 344. For a two slide drawer slide assembly 404 including only a first slide 360 and a second slide assembly 344, one damped stop assembly 432 would be used for the second slide assembly 344. For a four or more slide drawer slide assembly 404 including first slide 360, multiple second slide assemblies 344, and third slide 324, two damped stop assemblies 432 would be used for each of the multiple second slide assemblies 344.

Referring now to FIG. 4f, a diagram illustrating a second slide 428 in accordance with the preferred embodiment of the present invention is shown. Key dimensions in millimeters are shown only as a guide and representation of working dimensions for the preferred embodiment. The second slide 428 is different in construction than either the first slide 360 or the third slide 324. No cantilever spring stops 416 are provided for the second slide 428, although the second slide 428 has a large and small cutout adjacent to a raised portion where each of the damped stop assemblies 432 are fastened. The cutouts allow a cantilever spring stop 416 from each of the first slide 360 and third slide 324 to make contact with each of the two damped stop assemblies 432. Second slide 428 also has a raised portion near each end where a damped stop assembly 432 is mounted to a slotted hole 436.

Each of the two slotted holed 436 is arranged longitudinally with the second slide 428, in order to allow for movement of each of the damped stop assemblies 432. The damped stop assemblies 432 move toward the ends of the second slide 428 when the cantilever spring stops 416 make contact with the inside surface of each damped stop assembly 432 when fully extending a drawer 212. The damped stop assemblies 432 move toward the center of the second slide 428 when the first hard stop 412 and second hard stop 424 make contact with the outside surface of each damped stop assembly 432 when fully retracting or closing a drawer 212.

Referring now to FIG. 4g, a diagram illustrating an exploded view of the second slide assembly 344 in accordance with the preferred embodiment of the present invention is shown. Second slide assembly 344 includes the second slide 428 and two damped stop assemblies 432.

Each damped stop assembly 432 includes a stop tray 444 mounted below the slotted hole 436, two elastomeric pieces 452 mounted within the stop tray 444, a stop cap 448 retaining the elastomeric pieces 452, and a damped stop assembly fastener 440 coupling the stop cap 448 to the stop tray 444. When assembled, each elastomeric piece 452 is located on an opposite side and in the same plane as the raised portion of the second slide 428 including the slotted hole 436.

Referring now to FIG. 4h, a diagram illustrating a stop tray 444 in accordance with the preferred embodiment of the present invention is shown. Key dimensions in millimeters are shown only as a guide and representation of working dimensions for the preferred embodiment. In the preferred embodiment, the stop tray 444 includes a threaded stud 456 to retain the damped stop assembly fastener 440 and provide a standoff to support the stop cap 448. By using a threaded fastener as the damped stop assembly fastener 440, assembly and maintenance of the damped stop assembly 432 is simplified over alternative fastening means including welding or riveting. However, in other embodiments the damped stop assembly fastener 440 may be a rivet or other form of mechanical fastener known in the art. Regardless of how the stop cap 448 is fastened to the stop tray 444, it is important that the stop cap 448 not bear on the elastomeric pieces 452 to prevent longitudinal compression when any of a first hard stop 412, second hard stop 424, or cantilever spring stop 416 makes contact with the stop tray 444.

Referring now to FIG. 4i, a diagram illustrating a stop cap 448 in accordance with the preferred embodiment of the present invention is shown. Key dimensions in millimeters are shown only as a guide and representation of working dimensions for the preferred embodiment. The stop cap 448 retains the elastomeric pieces 452 in the stop tray 444 when the damped stop assembly 432 is coupled to the second slide 428.

Referring now to FIG. 4j, a diagram illustrating an elastomeric material 452 in accordance with the preferred embodiment of the present invention is shown. Key dimensions in millimeters are shown only as a guide and representation of working dimensions for the preferred embodiment. The elastomeric material 452 is a resilient material made from thermoplastic polyurethane that retains the original shape after deforming forces are removed. In the preferred embodiment, the elastomeric material 452 is TPU 70 A High Performance Thermoplastic Polyurethane material from Shen Zhen Polylong Plastic Ltd. and has a durometer of 70 A.

In the preferred embodiment, the two elastomeric pieces 452 are identical and provide the same amount of shock reduction when fully extending or closing a drawer 212. However, in alternate embodiments, each elastomeric piece 452 in a damped stop assembly 432 may be different in order to provide different shock reduction properties when fully extending or closing a drawer 212. For example, each of the two elastomeric pieces 452 may have a slightly different size or shape, or be manufactured from materials having different compression and/or expansion properties.

Referring now to FIG. 4k, a diagram illustrating a damped stop assembly 432 in an uncompressed state in accordance with embodiments of the present invention is shown. The uncompressed state refers to a state other than when a drawer 212 is fully extended or fully closed. In the uncompressed state, neither elastomeric piece 452 is in compression since neither of a first hard stop 412, second hard stop 424, or cantilever spring stop 416 makes contact with the stop tray 444 containing the elastomeric pieces 452.

Referring now to FIG. 4l, a diagram illustrating a damped stop assembly 432 in a compressed state in accordance with embodiments of the present invention is shown. The compressed state refers to a state when a drawer 212 is either fully extended or fully closed. In the compressed state, one elastomeric piece 452 is in compression since the first hard stop 412, second hard stop 424, or cantilever spring stop 416 is in contact with the stop tray 444 containing the elastomeric pieces 452.

In FIG. 4l, the outer elastomeric piece 452b is compressed, and the inner elastomeric piece 452a is uncompressed. This means one of the first hard stop 412 or second hard stop 424 is in contact with the outer (right side) edge of the stop tray 444—reflecting the drawer 212 is fully closed in the chassis 304. The hard stop 412, 424 in contact with the stop tray 444 causes the damped stop assembly 432 to move toward the center of the second slide 428, and the threaded stud 456 correspondingly moves within the slotted hole 436. When the hard stop 412, 424 moves away from the stop tray 444, elastomeric piece 452b expands to its original shape, moving the damped stop assembly 432 back to the uncompressed state (FIG. 4k).

Referring now to FIG. 5a, a diagram illustrating a pre-installation drawer latch assembly in accordance with embodiments of the present invention is shown. The pre-installation drawer latch assembly includes a latch base bracket 352 that captures the drawer latch assembly to the chassis 304 inside bottom surface. The pre-installation drawer latch assembly also includes a latch strike plate assembly 504, which includes a resilient element that returns an over-traveled drawer 212 to a latching position. The latch strike plate assembly 504 in the preferred embodiment is attachable to and detachable from the latch base bracket 352 without requiring tools.

Referring now to FIG. 5b, a diagram illustrating a post-installation drawer latch assembly in accordance with embodiments of the present invention is shown. The post-installation drawer latch assembly is the compliant drawer latch 348, which includes the latch strike plate assembly 504 secured to the latch base bracket 352.

Referring now to FIG. 5c, a diagram illustrating a post-installation drawer latch assembly over-travel limit in accordance with embodiments of the present invention is shown. When the rear of a drawer front surface 340 makes contact with the front of a latch strike plate assembly 504, the drawer 212 over-travels up to a predetermined distance 508 as a resilient member of the latch strike plate assembly 504 applies force in the first direction to the drawer 212. In the preferred embodiment, the predetermined distance 508 is 4 mm. If the drawer 212 over-travels the predetermined distance 508, a hard stop in the latch strike plate assembly 504 prevents further over-travel and possible damage to the resilient member of the latch strike plate assembly 504. Once the drawer 212 over-travel has been stopped, the resilient member returns the drawer 212 to a latching position.

Referring now to FIG. 5d, a diagram illustrating a latch base bracket 352 in accordance with the preferred embodiment of the present invention is shown. Key dimensions in millimeters are shown only as a guide and representation of working dimensions for the preferred embodiment. Latch base bracket 352 receives the latch strike plate assembly 504 in a latch base pocket 552 in the upper half of the latch base bracket 352, and holes in the base allow the latch base bracket 352 to be positively fastened to the base of the chassis 304. Any suitable fastener can be used to fasten the latch base bracket 352 to the chassis 304, including rivets, machine screws, or welds. The latch base bracket 352 forms a first portion of the compliant drawer latch 348.

The latch base bracket 352 includes a latch base bracket recess 512 in the lower half of the latch base bracket 352. The latch base bracket recess 512 captures a mating projection of the latch strike plate assembly 504 to prevent the latch strike plate assembly 504 from becoming separated from the latch base bracket 352 once installed. However, FIG. 5n illustrates the latch strike plate assembly 504 being intentionally mounted to or removed from the latch base bracket 352 without the use of tools.

In the preferred embodiment, the latch base bracket 352 is bent from a single section of 1.2 mm-1.5 mm sheet steel such that the vertical portion is a double thickness of sheet metal and the top surface of the latch base bracket 352 is rounded. The double thickness of material results in a stronger bracket able to resist deflecting forces, and provides greater engagement depth for threaded PEM stud 520 and latch strike plate side tabs 528. The rounded upper surface eases assembly when mating the latch strike plate assembly 504 to the latch base bracket 352.

Referring now to FIG. 5e, a diagram illustrating an exploded view of a latch strike plate assembly 504 in accordance with the preferred embodiment of the present invention is shown. The latch strike plate assembly 504 includes five components, which are assembled in the sequence shown. The latch strike plate assembly forms a second portion of the compliant drawer latch 348.

A latch strike plate 524 directly interfaces with the drawer 212, and provides features that properly horizontally position the latch strike plate assembly 504 relative to the latch base bracket 352. Latch strike plate 524 includes latch strike plate side tabs 528, which extend rearward from the top of the latch strike plate 524 and horizontally capture the upper sides of the latch base bracket 352 when installed. The latch strike plate side tabs 528 also limit rotation of the latch strike plate 524 when the drawer thumbscrew 328 is tightened. Latch strike plate 524 also includes a threaded PEM stud 520, which captures a fastener 548 that holds the latch strike plate assembly 504 together. Threaded PEM stud 520 rests within the latch base pocket 552 when the latch strike plate assembly 504 is mated to the latch base bracket 352.

A latch return spring 516 serves as the resilient member of the latch strike plate assembly 504, and provides force in the first direction 332 to return an over-traveled drawer 212 to a latching position. When the latch strike plate assembly 504 is mated with the latch base bracket 352, in the preferred embodiment the latch return spring 516 is compressed 1 mm.

A latch spring cap plate 532 captures the latch return spring 516 to the latch strike plate 524, and provides a bearing surface for the latch strike plate assembly 504 to mount to the latch base bracket 352. The latch spring cap plate 532 also has a cap plate projection 540 that mates with the latch base bracket recess 512 when the latch strike plate assembly 504 is installed to the latch base bracket 352. The latch spring cap plate 532 also includes two latch spring cap plate side tabs 536, arranged one on each side and extending toward the latch strike plate 524, that provide a hard stop for drawer 212 over-travel. The latch spring cap plate side tabs 536 limit drawer 212 over-travel to the predetermined distance 508 discussed with respect to FIG. 5c. The length of the latch spring cap plate side tabs 536 is selected in order to prevent over-compression of the latch return spring 516 in addition to setting the pre-determined distance 508.

A washer 544 provides a bearing surface between the fastener 548 and the rear surface of the latch base bracket 352. The fastener 548 engages threads of the threaded PEM stud 520 to hold the latch strike plate assembly 504 together. The fastener 548 must be installed to a sufficient depth to allow the latch strike plate assembly 504 to be installed to and removed from the latch base bracket 352 under latch return spring 516 tension. The washer 544 and fastener 548 orientation with respect to the latch strike plate assembly 504 and latch base bracket 352 is shown in more detail in FIG. 5c. In the preferred embodiment, the latch strike plate 524, latch spring cap plate 532, and the washer 544 are formed from 1.5 mm thick Zinc coated sheet steel. In the preferred embodiment, the fastener 548 is a 6-32 pan head screw pre-treated with a thread adhesive to hold the screw in place, and tightened to a torque specification of 6.0+/−0.6 in-lbs.

Referring now to FIG. 5f, a diagram illustrating a latch strike plate 524 in accordance with the preferred embodiment of the present invention is shown. Key dimensions in millimeters are shown only as a guide and representation of working dimensions for the preferred embodiment. The latch strike plate 524 has a flat front surface which makes contact with an over-traveled drawer 212. Other features of the latch strike plate 524 are discussed with respect to FIG. 5e.

Referring now to FIG. 5g, a diagram illustrating a latch spring cap plate 532 in accordance with the preferred embodiment of the present invention is shown. Key dimensions in millimeters are shown only as a guide and representation of working dimensions for the preferred embodiment. The latch spring cap plate 532 is preferably formed from a single piece of sheet steel, and bears against the front side of the latch base bracket 352 when installed. Other features of the latch spring cap plate 532 are discussed with respect to FIG. 5e.

Referring now to FIG. 5h, a diagram illustrating a threaded PEM stud 520 in accordance with the preferred embodiment of the present invention is shown. Key dimensions in millimeters are shown only as a guide and representation of working dimensions for the preferred embodiment. The threaded PEM stud 520 is swaged into the front surface of the latch strike plate 524, which provides a flat front surface for an over-traveled drawer 212 to bear against. The threaded PEM stud 520 is oriented toward the latch spring cap plate 532, as shown in FIG. 5e.

Referring now to FIG. 5i, a diagram illustrating a latch return spring 516 in accordance with the preferred embodiment of the present invention is shown. Key dimensions in millimeters are shown only as a guide and representation of working dimensions for the preferred embodiment. The latch return spring 516 is a resilient member that normally avoids a hard stop when a drawer 212 over-travels. The latch return spring 516 absorbs the drawer 212 movement in the second direction 368, and exerts force to move the over-traveled drawer 212 in the first direction 332 to the latching position. Once in the latching position, the drawer 212 is not in an over-traveled state and can be secured to the compliant drawer latch 348 with a drawer thumbscrew 328. In the preferred embodiment, the latch return spring 516 is manufactured from stainless steel per ASTM A313 and has a spring rate of 14.98+/−1.5 lbs per inch. Additionally, the latch return spring 516 has 5.16 coils, a free length of 0.375 in, and is manufactured from 0.028 in. diameter material.

Referring now to FIG. 5j, a diagram illustrating a fastener 548 in accordance with the preferred embodiment of the present invention is shown. Key dimensions in millimeters are shown only as a guide and representation of working dimensions for the preferred embodiment. The fastener 548, or first threaded fastener, has external threads that engage threads of the threaded PEM stud 520, and the fastener 548 passes through the slot in the upper half of the latch base bracket 352 when the latch strike plate assembly 504 is mated to the latch base bracket 352. In one embodiment, the fastener 548 is a thumbscrew, and no tools are required in order to assemble the latch strike plate assembly 504. In other embodiments, the fastener 548 is a cap head or other type of machine screw and a screwdriver is used to assemble the latch strike plate assembly 504.

Referring now to FIG. 5k, a diagram illustrating a washer 544 in accordance with the preferred embodiment of the present invention is shown. Key dimensions in millimeters are shown only as a guide and representation of working dimensions for the preferred embodiment. The washer 544 provides a bearing surface between the fastener 548 and the rear side of the latch base bracket 352.

Referring now to FIG. 5l, a diagram illustrating an over-traveled drawer 212 in contact with a complaint drawer latch 348 in accordance with the preferred embodiment of the present invention is shown. An over-traveled drawer 212 is a drawer 212 that has traveled past a latching position. The drawer front surface 340 contacts the latch strike plate 524, which compresses the latch return spring 516. Normally, the latch return spring 516 exerts force against the rear of the latch strike plate 524 and returns the drawer 212 to the latching position where it can be secured by a drawer thumbscrew 328. However, a maximum over-travel position 556 may be reached where the latch strike plate assembly 504 is compressed the predetermined distance 508, and the latch spring cap plate side tabs 536 are in contact with the rear surface of the latch strike plate 524. In this position, the latch return spring 516 may not be compressed more since further compression would either permanently set the latch return spring 516 or damage the function of the latch return spring 516. For reference purposes, the position of the drawer thumbscrew 560 is shown disengaged.

Referring now to FIG. 5m, a diagram illustrating a non over-traveled drawer 212 in contact with a compliant drawer latch 348 and secured by a drawer thumbscrew 328 in accordance with the preferred embodiment of the present invention is shown. FIG. 5m illustrates a drawer 212 in the latching position, where the rear of drawer front surface 340 is in contact with the latch strike plate assembly 504 and the drawer 212 has not compressed the latch return spring 516. Internal threads of the threaded PEM stud 520 capture the fastener 548 from the back side and a drawer thumbscrew 328 from the front side, when the drawer 212 is in the latching position.

Referring now to FIG. 5n, a diagram illustrating installation of a latch strike plate assembly from a latch base bracket in accordance with the preferred embodiment of the present invention is shown. The latch strike plate assembly 504 is first positioned over the latch base bracket 352 such that the washer 544 and fastener 548 are oriented behind the rear surface of the latch base bracket 352, and the latch spring cap plate 532 is oriented above the front surface of the latch base bracket 352. Next, the top surface of the latch spring cap plate 532 is deflected rearward as shown in order to move the cap plate projection 540 forward. The latch strike plate 524 is pinched toward the washer 544, opening a gap at the bottom to slide over the latch base bracket 352. The latch strike plate assembly 504 is then moved downward onto the latch base bracket 352 so that the deflected latch spring cap plate 532 is in front of the latch base bracket 352, and the washer 544 and fastener 548 are behind the latch base bracket 352. While the latch strike plate assembly 504 is being moved downward, the threaded PEM stud 520 of the latch strike plate assembly 504 slides within the latch base pocket 552 of the latch base bracket 352. Finally, when the threaded PEM stud 520 bottoms within the latch base pocket 552, rearward deflection of the latch spring cap plate 532 is relieved, resulting in the cap plate projection 540 engaging the latch base bracket recess 512 of the latch base bracket 352. Once engaged, the latch strike plate assembly 504 is mated to the latch base bracket 352, resulting in the compliant drawer latch 348. The spring force of the latch return spring 516 maintains the cap plate projection 540 in the latch base bracket recess 512. The latch strike plate assembly 504 may be removed from the latch base bracket 352 by reversing the above process, beginning with deflecting the latch spring cap plate 532 rearward.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. A compliant drawer latch, comprising:
  a first portion fixable to an inside surface of a chassis; and
  a second portion coupled to the first portion, comprising:
    a latch strike plate;
    a latch spring cap plate;
    a latch return spring, arranged between the latch strike plate and the latch spring cap plate; and
    a first threaded fastener configured to retain the latch strike plate and latch return spring to the latch spring cap plate,
  wherein a drawer is operable to contact the latch strike plate when the drawer is seated in the chassis, wherein when the drawer over-travels the latch strike plate compresses the latch return spring up to a predetermined distance, wherein the compressed latch return spring applies force to the latch strike plate to return the latch strike plate to a latching position when the drawer rebounds from over-travel, wherein the first portion is configured to remain coupled to the second portion regardless of position, presence, or absence of the drawer.

2. The compliant drawer latch of claim 1, wherein the latch strike plate comprises a threaded stud, wherein the threaded stud extends toward the latch spring cap plate and provides threading for the first threaded fastener to couple the latch spring cap plate, the latch return spring, and the latch strike plate.

3. The compliant drawer latch of claim 2, wherein the first threaded fastener is a thumbscrew, wherein the second portion is assembled without requiring tools.

4. The compliant drawer latch of claim 2, wherein the latch return spring is compressed when the second portion is coupled to the first portion, wherein the latch return spring is a coil spring and the first threaded fastener is oriented axially within the latch return spring.

5. The compliant drawer latch of claim 2, wherein a second threaded fastener is configured to positively seat the drawer in the chassis, wherein the second threaded fastener is configured to engage the threaded stud from an opposite end of the threaded stud as the first threaded fastener, wherein the second threaded fastener is configured to couple the drawer to the compliant drawer latch.

6. The compliant drawer latch of claim 1, wherein the latch spring cap plate further comprises a projection, wherein the first portion comprises a recess that captures the projection when the second portion is coupled to the first portion.

7. The compliant drawer latch of claim 6, wherein the second portion is configured to be coupled to the first portion without requiring tools, wherein the second portion is configured to be uncoupled from the first portion without requiring tools.

8. The compliant drawer latch of claim 7, wherein after the second portion is coupled to the first portion, the second portion is configured to be uncoupled from the first portion by deflecting a top surface of the latch spring cap plate away from the latch strike plate and pulling the second portion upward from the first portion, wherein the latch return spring exerts force to maintain the projection of the latch spring cap plate in the recess of the first portion when the top surface of the latch spring cap plate is not deflected away from the latch strike plate.

9. The compliant drawer latch of claim 1, wherein the latch spring cap plate comprises side tabs extending toward the latch strike plate that provide a minimum separation between the latch strike plate and the latch spring cap plate, wherein the minimum separation is configured to prevent over-compression of the latch return spring, wherein when the second portion is coupled to the first portion, the latch strike plate is configured to move axially relative to the latch spring cap plate when the drawer makes contact with the latch strike plate.

10. The compliant drawer latch of claim 1, wherein the latch strike plate comprises side tabs that are configured to limit sideways movement of the second portion when the second portion is coupled to the first portion, wherein the side tabs of the latch strike plate extend rearward past the latch spring cap plate.

11. The compliant drawer latch of claim 1, wherein the drawer is operable to move in a first direction when closing, wherein the latch return spring exerts force in a direction opposite to the first direction when the drawer over-travels in the first direction, wherein the latch return spring is configured to move the drawer to a latching position that is not over-traveled.

12. A shock absorbing chassis for a sliding drawer, comprising:
  a chassis, wherein the drawer is operable to move relative to the chassis in a first direction when extending from the chassis, wherein the drawer is operable to move relative to the chassis in a second direction when retracting into the chassis, the chassis comprising:
    a latch base bracket affixed to an inside surface of the chassis; and
    a latch strike plate assembly comprising a latch return spring, coupled to the latch base bracket, wherein the latch strike plate assembly remains coupled to the latch base bracket regardless of position, presence, or absence of the drawer,
  wherein the drawer is operable to contact the latch strike plate assembly when the drawer is seated in the chassis, wherein when the drawer over-travels the latch strike plate assembly compresses up to a predetermined distance, wherein the latch strike plate assembly is configured to be installed and is removed from the latch base bracket without requiring tools.

13. The shock absorbing chassis for the sliding drawer of claim 12, wherein the latch strike plate assembly further comprises:
a latch strike plate; and
a latch spring cap plate,
wherein a first end of the latch return spring bears against the latch strike plate and a second end opposite to the first end bears against the latch spring cap plate,
wherein the latch strike plate comprises a threaded stud, wherein the threaded stud extends in the second direction and provides threading for a first threaded fastener configured to couple the latch spring cap plate, the latch return spring, and the latch strike plate.

14. The shock absorbing chassis for the sliding drawer of claim 13, wherein the latch return spring is compressed when the first threaded fastener couples the latch strike plate assembly to the latch base bracket.

15. The shock absorbing chassis for the sliding drawer of claim 13, wherein a second threaded fastener is configured to positively seat the drawer in the chassis, wherein the second threaded fastener is configured to engage the threaded stud from an opposite end of the threaded stud as the first threaded fastener, wherein the second threaded fastener is configured to couple the drawer to the latch strike plate assembly in a latching position.

16. The shock absorbing chassis for the sliding drawer of claim 13, wherein the latch spring cap plate further comprises a projection extending in the second direction, wherein the latch base bracket comprises a cutout that is configured to capture the projection when the latch strike plate assembly is coupled to the latch base bracket.

17. The shock absorbing chassis for the sliding drawer of claim 16, wherein after the latch strike plate assembly is coupled to the latch base bracket, a top surface of the latch spring cap plate is configured to be deflected in the second direction in order to uncouple the latch strike plate assembly from the latch base bracket, wherein the latch return spring is configured to exert force to maintain the projection in the cutout when the top surface of the latch spring cap plate is not deflected in the second direction.

18. The shock absorbing chassis for the sliding drawer of claim 13, wherein the latch spring cap plate comprises side tabs extending in the first direction that provide a minimum separation between the latch strike plate and the latch spring cap plate, wherein when the latch strike plate assembly is coupled to the latch base bracket, wherein the minimum separation is configured to prevent over-compression of the latch return spring, the latch strike plate is configured to move axially relative to the latch spring cap plate when the drawer makes contact with the latch strike plate.

19. The shock absorbing chassis for the sliding drawer of claim 18, wherein the side tabs of the latch spring cap plate contact the latch strike plate before the latch return spring is fully compressed.

20. The shock absorbing chassis for the sliding drawer of claim 13, wherein the latch strike plate comprises side tabs extending in the second direction that limit sideways movement of the latch spring cap plate when the latch strike plate is coupled to the latch spring cap plate, wherein the side tabs of the latch strike plate are configured to limit sideways movement of the latch strike plate assembly relative to the latch base bracket when the latch strike plate assembly is coupled to the latch base bracket.

* * * * *